(12) United States Patent
Jang

(10) Patent No.: US 9,704,961 B2
(45) Date of Patent: Jul. 11, 2017

(54) SEMICONDUCTOR STRUCTURE HAVING BURIED GATE STRUCTURE, METHOD FOR MANUFACTURING THE SAME, AND MEMORY CELL HAVING THE SAME

(71) Applicant: SK hynix Inc., Gyeonggi-do (KR)

(72) Inventor: Tae-Su Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/090,759

(22) Filed: Apr. 5, 2016

(65) Prior Publication Data
US 2017/0125532 A1 May 4, 2017

(30) Foreign Application Priority Data
Oct. 29, 2015 (KR) ........................ 10-2015-0150915

(51) Int. Cl.
*H01L 21/02* (2006.01)
*H01L 29/423* (2006.01)
*H01L 21/28* (2006.01)
*H01L 29/51* (2006.01)
*H01L 27/108* (2006.01)

(52) U.S. Cl.
CPC .... *H01L 29/4236* (2013.01); *H01L 21/02186* (2013.01); *H01L 21/02255* (2013.01); *H01L 21/28088* (2013.01); *H01L 21/28176* (2013.01); *H01L 27/10876* (2013.01); *H01L 29/513* (2013.01); *H01L 29/517* (2013.01)

(58) Field of Classification Search
CPC ... H01L 21/00; H01L 21/02; H01L 21/02186; H01L 21/02255; H01L 21/28088; H01L 21/28176; H01L 21/3205; H01L 21/28; H01L 21/324; H01L 21/425; H01L 21/4763
USPC ........................................................ 438/589
See application file for complete search history.

(56) References Cited

U.S. PATENT DOCUMENTS

| | | | | |
|---|---|---|---|---|
| 2008/0230801 | A1* | 9/2008 | Murakoshi | .......... H01L 29/4236 257/172 |
| 2012/0119285 | A1* | 5/2012 | Yang | ................ H01L 27/10876 257/329 |
| 2014/0061781 | A1* | 3/2014 | Kim | .................. H01L 27/10876 257/331 |
| 2014/0159145 | A1 | 6/2014 | Park et al. | |
| 2014/0367774 | A1 | 12/2014 | Yoo et al. | |

* cited by examiner

*Primary Examiner* — Chuong A Luu
(74) *Attorney, Agent, or Firm* — IP & T Group LLP

(57) ABSTRACT

A method for forming a semiconductor structure includes forming a trench in a semiconductor substrate; forming a gate dielectric layer over a bottom surface and sidewalls of the trench; forming a work function layer over the gate dielectric layer; recessing the work function layer, and forming a gate electrode which is positioned in the trench; and exposing the gate electrode to a thermal process, and forming a dipole induction layer between the gate electrode and the gate dielectric layer.

20 Claims, 16 Drawing Sheets

SEMICONDUCTOR STRUCTURE HAVING BURIED GATE STRUCTURE, METHOD FOR MANUFACTURING THE SAME, AND MEMORY CELL HAVING THE SAME

CROSS-REFERENCE TO RELATED APPLICATION

This application claims priority under 35 U.S.C. §119 to Korean Patent Application No. 10-2015-0150915 filed on Oct. 29, 2015, the disclosure of which is herein incorporated by reference in its entirety.

TECHNICAL FIELD

Exemplary embodiments relate to a semiconductor device, and more particularly, to a semiconductor structure having a buried gate structure, a method for manufacturing the same, and a memory cell having the same.

DISCUSSION OF THE RELATED ART

A metal gate electrode is applied to a high-performance transistor. Particularly, in a buried gate type transistor, control of a threshold voltage is required for high performance operation. Additionally, a gate-induced drain leakage (GIDL) characteristic exerts a substantial influence on performance of a buried gate type transistor.

SUMMARY

Various embodiments are directed to a semiconductor structure capable of shifting a threshold voltage, and a method for manufacturing the same. Various embodiments are directed to a semiconductor structure capable of improving gate-induced drain leakage (GIDL), and a method for manufacturing the same. Various embodiments are directed to a memory cell capable of improving a refresh characteristic. Various embodiments are directed to an electronic device with improved performance.

In an embodiment, a method for forming a semiconductor structure may include: forming a trench in a semiconductor substrate; forming a gate dielectric layer over a bottom surface and sidewalls of the trench; forming a work function layer over the gate dielectric layer; recessing the work function layer to form a gate electrode which is recessed in the trench; and exposing the gate electrode to a thermal process to form a dipole induction layer between the gate electrode and the gate dielectric layer. The thermal process is performed in an oxygen-free atmosphere. The forming of the dipole induction layer is performed by rapid thermal annealing. The rapid thermal annealing is performed in a nitrogen or argon atmosphere. An oxygen areal density of the dipole induction layer is higher than an oxygen areal density of the gate dielectric layer. The work function layer and the dipole induction layer may include same metal atom. The work function layer may include a metal-base material, and the dipole induction layer may include oxide which contains a metal of the metal-base material. The work function layer may include titanium nitride, and the dipole induction layer may include titanium oxide. The forming of the work function layer may include: forming conformally a first work function layer over the gate dielectric layer; and filling a second work function layer over the first work function layer, wherein the dipole induction layer is formed by a reaction of a portion of the first work function layer and a portion of the gate dielectric layer. The first work function layer may include titanium nitride, and the second work function layer may include tungsten. Each of the first work function layer and the second work function layer may include titanium nitride. The gate dielectric layer may include silicon oxide, the work function layer may include titanium nitride, and the dipole induction layer may include titanium oxide.

In an embodiment, a method for forming a semiconductor structure may include: forming a trench in a semiconductor substrate; forming a gate dielectric layer over a bottom surface and sidewalls of the trench; forming a first work function layer over the gate dielectric layer; exposing the first work function layer to a thermal process to form a pre-dipole induction layer between the first work function layer and the gate dielectric layer; forming a second work function layer over the first work function layer to fill the trench; recessing the second work function layer and the first work function layer to form a second work function portion and a first work function portion in the trench; and recessing the pre-dipole induction layer to form a dipole induction layer between the first work function portion and the gate dielectric layer. The thermal process is performed in an oxygen-free atmosphere. The forming of the dipole induction layer is performed by rapid thermal annealing. The rapid thermal annealing is performed in a nitrogen or argon atmosphere. The first work function layer may include titanium nitride, and the dipole induction layer may include titanium oxide. The method may further include after the forming of the dipole induction layer, forming a third work function layer over the first work function portion and the second work function portion; recessing the third work function layer to form a third work function portion; forming a capping layer over the third work function portion; and introducing a dopant into the semiconductor substrate by using the capping layer as a barrier to form doping regions which overlap the third work function portion. Each of the doping regions does not overlap with the dipole induction layer. The third work function layer has a work function lower than the first work function layer and the second work function layer.

In an embodiment, a method for forming a semiconductor structure may include: forming a trench in a semiconductor substrate; forming a gate dielectric layer over a bottom surface and sidewalls of the trench; forming a work function layer which fills the trench and is provided over the gate dielectric layer; planarizing the work function layer to form a pre-work function portion, wherein a top surface of the pre-work function portion is at a level higher than a top surface of the semiconductor substrate; exposing the pre-work function portion to a thermal process to form a pre-dipole induction layer between the pre-work function portion and the gate dielectric layer; recessing the pre-work function portion to form a work function portion in the trench; and recessing the pre-dipole induction layer to form a dipole induction layer between the work function portion and the gate dielectric layer. The thermal process is performed in an oxygen-free atmosphere. The forming of the dipole induction layer is performed by rapid thermal annealing. The rapid thermal annealing is performed in a nitrogen or argon atmosphere. The work function layer may include titanium nitride, and the dipole induction layer may include titanium oxide. The forming of the work function layer may include: forming conformally a first work function layer over the gate dielectric layer; and filling a second work function layer in the trench and over the first work function layer, wherein the dipole induction layer is formed by a reaction of a portion of the first work function layer and a portion of the gate dielectric layer. The method may further include: after the forming of the dipole induction layer, filling a third work function layer in the trench and over the work function portion; recessing the third work function layer to form a third work function portion; filling a capping layer in the trench and over the third work function portion; and introducing a dopant into the semiconductor substrate by using the capping layer as a barrier to form doping regions which overlap with the third work function portion. The third work function layer has a work function lower than the first work function layer and the second work function layer. Each of the doping regions does not overlap with the dipole induction layer.

In an embodiment, a semiconductor structure may include: a semiconductor substrate including a first doping region and a second doping region; a trench formed in the semiconductor substrate and including a channel region between the first doping region and the second doping region; a gate electrode provided in the trench and including a first work function layer, wherein the first work function layer is formed over the channel region; a gate dielectric layer formed between the first work function layer and the channel region, and charged negatively; and a dipole induction layer formed between the gate dielectric layer and the first work function layer, and charged positively, wherein the dipole induction layer includes a first alloy of a first metal, wherein the first work function layer includes a second alloy of the first metal, and wherein the first alloy is a different material from the second alloy. The gate dielectric layer may include silicon oxide, the dipole induction layer may include metal oxide, and an oxygen areal density of the dipole induction layer is higher than an oxygen areal density of the silicon oxide. The dipole induction layer may include titanium oxide, and the first work function layer comprises titanium nitride. The gate electrode may further includes a second work function layer and a third work function layer, the second work function layer is provided over the first work function layer, and the third work function layer is positioned over the second work function layer and overlaps with the first and second doping regions. The first work function layer has a high work function which is higher than a mid-gap work function of silicon, and the third work function layer has a low work function which is lower than the mid-gap work function of silicon.

DETAILED DESCRIPTION

Figure 1A:
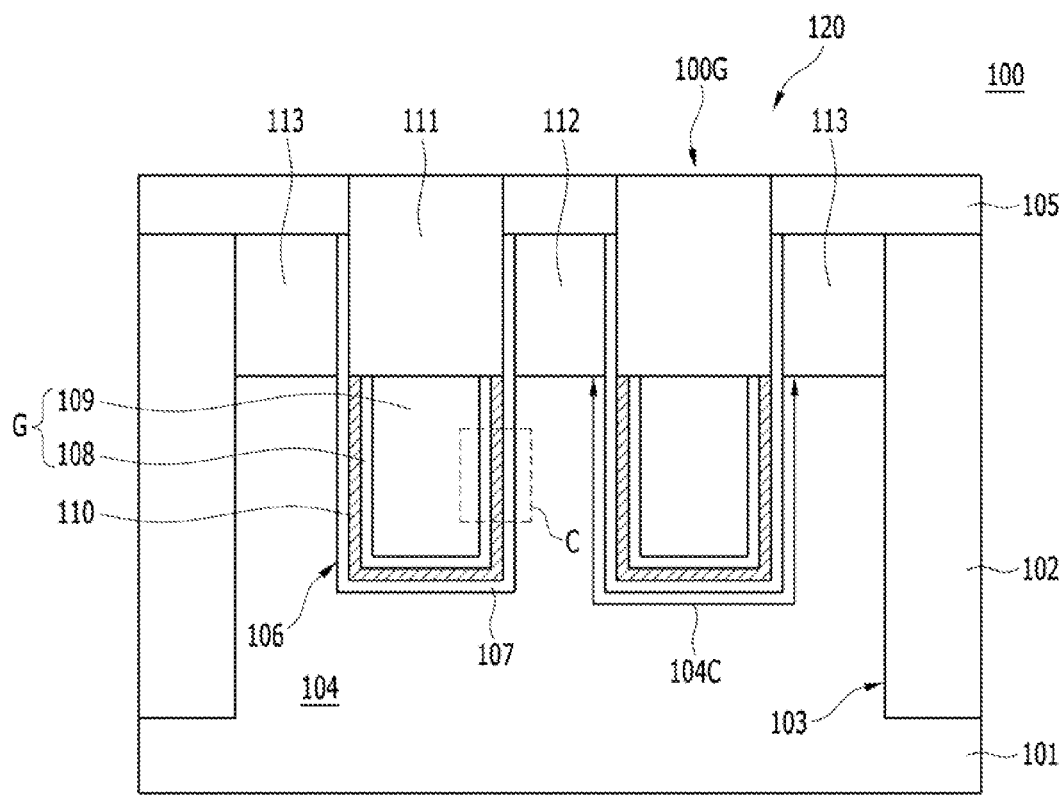
FIG. 1A is a view illustrating a semiconductor structure in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, the various figures, and embodiments of the present invention, like reference numerals refer to like parts.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Hereinbelow, in embodiments, a threshold voltage depends on a flat-band voltage. A flat-band voltage depends on a work function. A work function may be engineered by various methods. For example, a work function may be adjusted by a material of a gate electrode, a material between the gate electrode and a channel, a dipole, and so forth. By increasing or decreasing a work function, a flat-band voltage may be shifted. A high work function may shift a flat-band voltage in a positive direction, and a low work function may shift a flat-band voltage in a negative direction. By shifting a flat-band voltage as described above, it is possible to adjust a threshold voltage. In the embodiments, even though a channel concentration is decreased or channel doping is omitted, a threshold voltage may be adjusted by shifting a flat-band voltage. A flat-band voltage may be shifted by a dipole induction layer.

Figure 1B:
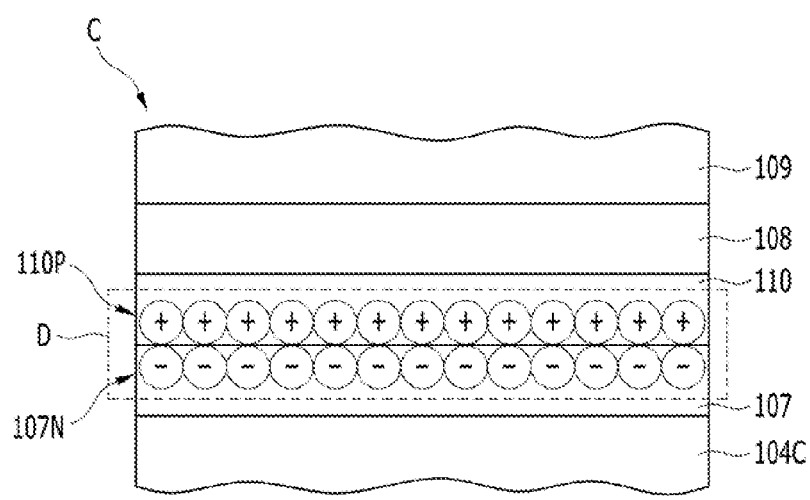
FIG. 1B is a view illustrating a dipole between a gate electrode and a channel region.

FIG. 1A is a view illustrating a semiconductor structure in accordance with a first embodiment. FIG. 1A shows a transistor 120 as a part of a semiconductor structure 100. FIG. 1B is a view illustrating a dipole between a gate electrode and a channel region.

The semiconductor structure 100 may include a substrate 101. An isolation layer 102 which defines an active region 104 may be formed in the substrate 101. A buried gate structure 100G may extend into the substrate 101. A gate trench 106 may be formed in the substrate 101. The gate trench 106 may be a line shape which traverses the active region 104 and the isolation layer 102. The buried gate structure 100G may be formed in the gate trench 106. The active region 104 may include a channel region 104C, a first doping region 112, and a second doping region 113. The transistor 120 may be a non-planar transistor, for example, a buried gate type transistor.

The substrate 101 may be a material appropriate for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbondoped silicon, a combination thereof, or a multi-layer thereof. The substrate 101 may include another semiconductor material such as germanium. The substrate 101 may include a III/V group semiconductor substrate, for example, a compound semiconductor substrate such as GaAs. The substrate 101 may include a silicon-on-insulator (SOI) substrate.

The isolation layer 102 which defines the active region 104 may be formed in the substrate 101. The isolation layer 102 may be a shallow trench isolation (STI) region. The isolation layer 102 may be formed in an isolation trench 103.

The channel region 104C, the first doping region 112 and the second doping region 113 may be formed in the active region 104. The channel region 104C may include the gate trench 106. The first doping region 112 and the second doping region 113 may be formed in the active region 104 and at both sides of the gate trench 106. The first doping region 112 and the second doping region 113 are regions which are doped with a conductivity type dopant. For example, a conductivity type dopant may include phosphorus (P), arsenic (As), antimony (Sb) or boron (B). The first doping region 112 and the second doping region 113 may be doped with the same conductivity type dopant. The first doping region 112 and the second doping region 113 may be referred to as a source region and a drain region, respectively.

The bottom surfaces of the first doping region 112 and the second doping region 113 may be positioned at a predetermined depth when measured from the top surface of the substrate 101. The first doping region 112 and the second doping region 113 may contact the first and second sidewalls of the gate trench 106, respectively. The bottom surfaces of the first doping region 112 and the second doping region 113 may be located at a higher level than the bottom surface of the gate trench 106. The first doping region 112 and the second doping region 113 may be configured symmetrical to each other. For example, the first doping region 112 and the second doping region 113 may form junctions to the same depth.

The buried gate structure 100G may be formed in the gate trench 106. The buried gate structure 100G may be simply referred to as an embedded BG. The buried gate structure 100G may be positioned in the gate trench 106 between the first doping region 112 and the second doping region 113.

The buried gate structure 100G may include a dipole induction layer 110 and a gate electrode G. The gate electrode G may include a first work function portion 108 and a second work function portion 109. The buried gate structure 100G may further include a gate dielectric layer 107 and a capping layer 111. The top surface of the gate electrode G may be positioned at a level lower than the top surface of the substrate 101. The gate electrode G may partially fill the gate trench 106. The gate electrode G may be referred to as a 'buried gate electrode.' The capping layer 111 may be positioned on the gate electrode G. The gate dielectric layer 107 may be formed on the bottom and sidewalls of the gate trench 106. The dipole induction layer 110 may be positioned between the first work function portion 108 of the gate electrode G and the gate dielectric layer 107.

The gate dielectric layer 107 may include silicon oxide, silicon nitride, silicon oxynitride, a high-k material, or a combination thereof. The high-k material may include a material which has a dielectric constant higher than the dielectric constant of silicon oxide. For example, the high-k material may include a material which has a dielectric constant higher than 3.9. For another example, the high-k material may include a material which has a dielectric constant higher than 10. For still another example, the high-k material may include a material which has a dielectric constant of 10 to 30.

The high-k material may include at least one metallic element. The high-k material may include a hafnium-containing material. The hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, or a combination thereof. As the high-k material, any conventional high-k material known in the art may be used.

As the gate dielectric layer 107, an appropriate material may be selected according to the dipole induction layer 110. For example, as the gate dielectric layer 107, a material which has a lower oxygen content, that is, an oxygen concentration, smaller than the dipole induction layer 110 may be selected. Here, the term "concentration" refers to the number of an element at interest over the total number of elements contained in a given layer. In the present embodiment, the gate dielectric layer 107 may be silicon oxide.

The channel length of the channel region 104C may extend along a contour of the gate trench 106. The channel region 104C according to the present embodiment has a longer channel length compared with a conventional planar type transistor. Thus, a short channel effect may be substantially prevented.

The gate electrode G may overlap with the channel region 104C, and may not overlap with the first and second doping regions 112 and 113. Here, the term "overlap" may mean horizontal overlap. That is, the term "overlap" means that two or more components, which are compared with each other, are located at substantially the same level. The top surface of the gate electrode G may be at a level lower than the top surface of the substrate 101. The second work function portion 109 of the gate electrode G may be metal-containing material with low resistivity. The gate electrode G may include a low-resistivity metal. The second work function portion 109 of the gate electrode G may include tungsten (W), aluminum (Al), or a combination thereof.

The dipole induction layer 110 may be positioned between the gate electrode G and the gate dielectric layer 107. More specifically, the dipole induction layer 110 may be positioned between the gate dielectric layer 107 and the first work function portion 108. The top surfaces of the dipole induction layer 110 and the gate electrode G may be at the same level. Each of the dipole induction layer 110 and the first work function portion 108 may be in a U-like shape.

The capping layer 111 may be formed on the gate electrode G. The capping layer 111 protects the gate electrode G. The capping layer 111 may include a dielectric material. The capping layer 111 may include silicon nitride, silicon oxynitride, or a combination thereof. In another embodiment, the capping layer 111 may include a stack of silicon nitride and silicon oxide. For example, a lining of silicon nitride is formed. Then, a spin-on-dielectric (SOD) may be formed on the lining to form the capping layer 111. In still another embodiment, the capping layer 111 may be a tri-layer including N(nitride)-O(oxide)-N(nitride).

A hard mask layer 105 may be formed on the first doping region 112 and the second doping region 113. The hard mask layer 105 may be extended to cover the top of the isolation layer 102. The hard mask layer 105 may include silicon oxide such as tetra-ethyl-ortho-silicate (TEOS). The dipole induction layer 110 will be described below in detail.

The dipole induction layer 110 may be a dielectric material. Accordingly, the resistivity of the gate electrode G may be decreased. The dipole induction layer 110 may be a high-k material in which a dielectric constant is higher than the gate dielectric layer 107. The dipole induction layer 110 may induce a high work function. A high work function refers to a work function higher than the mid-gap work function of silicon. A low work function refers to a work function lower than the mid-gap work function of silicon. For example, a high work function may be a work function higher than 4.5 eV, and a low work function may be a work function lower than 4.5 eV.

As the dipole induction layer 110 and the gate dielectric layer 107 contact each other, a dipole may be generated. Due to such a dipole, the work function of the first work function portion 108 may be increased. In order to generate the dipole, the dipole induction layer 110 and the gate dielectric layer 107 may have a different oxygen contents. The dipole induction layer 110 and the gate dielectric layer 107 may have different areal density of oxygen atoms from each other. For example, the dipole induction layer 110 has a higher oxygen areal density than the gate dielectric layer 107.

The dipole induction layer 110 may be include metal oxide which has a higher oxygen areal density than an oxygen areal density of the gate dielectric layer 107. In the case where the gate dielectric layer 107 is silicon oxide, the dipole induction layer 110 may include a material which has a higher oxygen areal density than an oxygen areal density of the silicon oxide.

A material with higher oxygen areal density may include aluminum oxide, titanium oxide, hafnium oxide, zirconium oxide, magnesium oxide, or a combination thereof. A material with lower oxygen areal density may include yttrium oxide, lanthanum oxide, germanium oxide, lutetium oxide, strontium oxide, or a combination thereof.

For example, the ratio of the oxygen areal density of aluminum oxide to the oxygen areal density of silicon oxide may be 1.21. The oxygen areal density of lanthanum oxide to the oxygen areal density of silicon oxide may be 0.77. The oxygen areal density of hafnium oxide to the oxygen areal density of silicon oxide may be 1.05. The dipole induction layer 110 may be formed to a thin thickness. Thus, the gate electrode G may be formed in a larger volume, and it is possible to significantly decrease the resistivity of the gate electrode G.

The first work function portion 108 may be a metal-containing material. The first work function portion 108 may include a first element and a second element. The first element may be metal atoms, and the second element may include nitrogen. The first element may be diffused by a thermal process. Thus, oxide of the first element may be formed between the first work function portion 108 and the gate dielectric layer 107. The oxide of the first element may become the dipole induction layer 110. That is, the dipole induction layer 110 may include the same first element as the first work function portion 108. For example, when a first work function portion 108 includes titanium nitride, the dipole induction layer 110 may include titanium oxide. Therefore, the first work function portion 108 and the dipole induction layer 110 may include titanium atoms.

FIG. 1B illustrates a region C between the gate electrode G and the channel region 104C. Referring to FIG. 1B, in the case where the first work function portion 108 includes titanium nitride, titanium of the titanium nitride and oxygen of the gate dielectric layer 107 react with each other to form titanium oxide. The titanium oxide may become the dipole induction layer 110. An oxygen areal density of the dipole induction layer 110 may be higher than the oxygen areal density of the gate dielectric layer 107.

That is, an oxygen areal density of the titanium oxide is higher than the oxygen areal density of the silicon oxide. Due to a difference in oxygen areal density, oxygen in the titanium oxide diffuses into the silicon oxide. In other words, as oxygen ions diffuse from the titanium oxide into the silicon oxide, the titanium oxide is positively charged as indicated by the reference symbol 110P, and the silicon oxide is negatively charged as indicated by the reference symbol 107N. As a result, a dipole D is formed at an interface between the dipole induction layer 110 and the gate dielectric layer 107.

The dipole D lowers the energy band of the gate electrode G, specifically, the first work function portion 108. As a result, the first work function portion 108 has an increased work function. Consequently, an effective work function of the gate electrode G increases, and a threshold voltage may be adjusted.

As described above, due to the dipole induction layer 110, the dipole D may be generated between the gate dielectric layer 107 and the dipole induction layer 110. The dipole D may be generated due to a difference in oxygen areal density between the dipole induction layer 110 and the gate dielectric layer 107. Such a dipole D may induce a high work function by increasing the work function of the first work function portion 108 of the gate electrode G. Accordingly, the threshold voltage may be adjusted.

As a result, due to the dipole induction layer 110, the channel dose of the channel region 104C may be decreased. By controlling the polarity direction of the dipole D, it is possible to control a work function. By such a dipole D, a high work function or a low work function may be induced. For example, in the case where the dipole induction layer 110 is a material which has an oxygen content per unit volume larger than the gate dielectric layer 107, a dipole may be generated in a direction where a high work function is induced. In the case where the dipole induction layer 110 is a material which has an oxygen content per unit volume smaller than the gate dielectric layer 107, a dipole may be generated in a direction where a low work function is induced. Since the dipole induction layer 110 is a material which has an oxygen content per unit volume larger than the gate dielectric layer 107, the dipole D may be generated in a direction where a change is made to a high work function.

Since the gate trench 106 has a high aspect ratio, it is difficult to perform sufficient doping of the gate trench 106 down to its bottom by using a conventional channel doping method. Therefore, after channel doping, additional channel doping is locally performed for doping the bottom portion of the gate trench 106. This is referred to as 'local channel doping.' In the case where implantation is adopted as local channel doping, the implantation is referred to as local channel implantation (LCI).

According to a present embodiment, since a threshold voltage may be adjusted by the dipole induction layer 110, the dose of the local channel doping (LCI) may be remarkably decreased or the local channel doping (LCI) may be omitted. Hence, in the present embodiment, since a channel dose may be decreased, a junction leakage characteristic may be improved.

Moreover, since the dipole induction layer 110 does not overlap the first and second doping regions 112 and 113, gate-induced drain leakage (GIDL) in the first doping region 112 and the second doping region 113 may be suppressed. In the case where the dipole induction layer 110 overlaps the first doping region 112 and the second doping region 113, gate-induced drain leakage (GIDL) may increase due to induction of a high work function. Thus, the dipole induction layer 110 may be configured not to overlap the first doping region 112 and the second doping region 113.

Figure 2A:
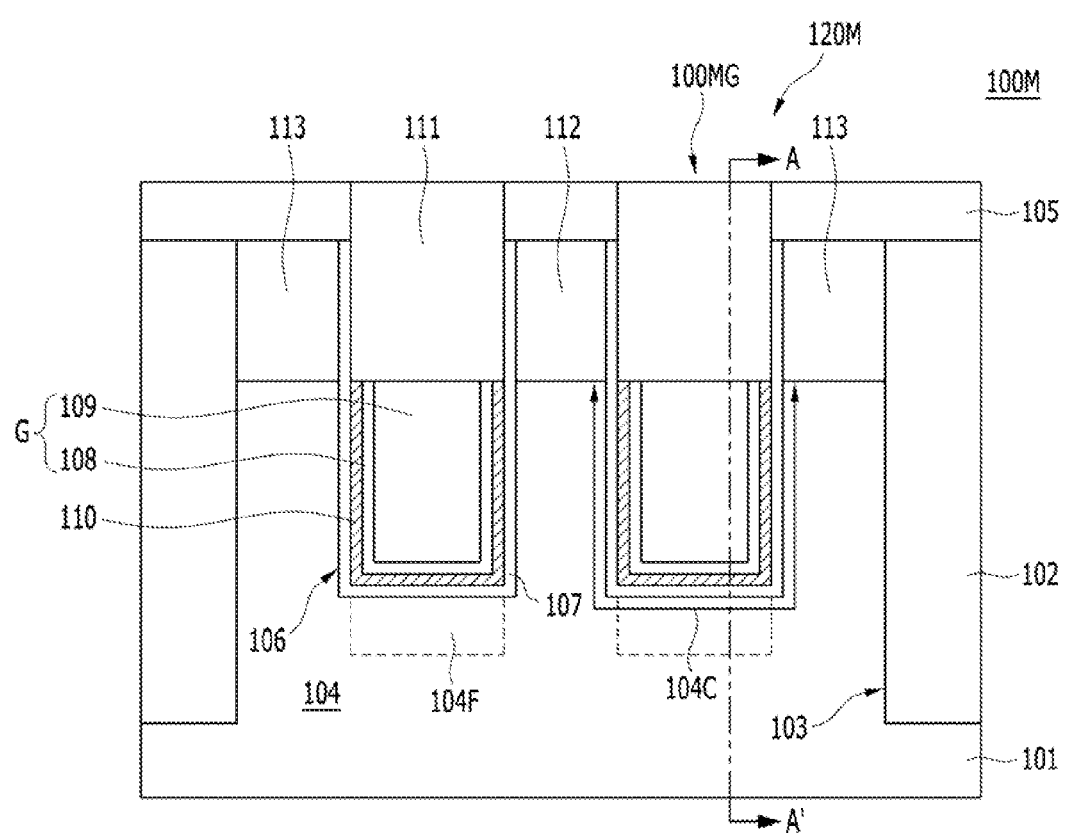
FIGS. 2A and 2B are views illustrating a semiconductor structure in accordance with a modification of the first embodiment.
Figure 2B:
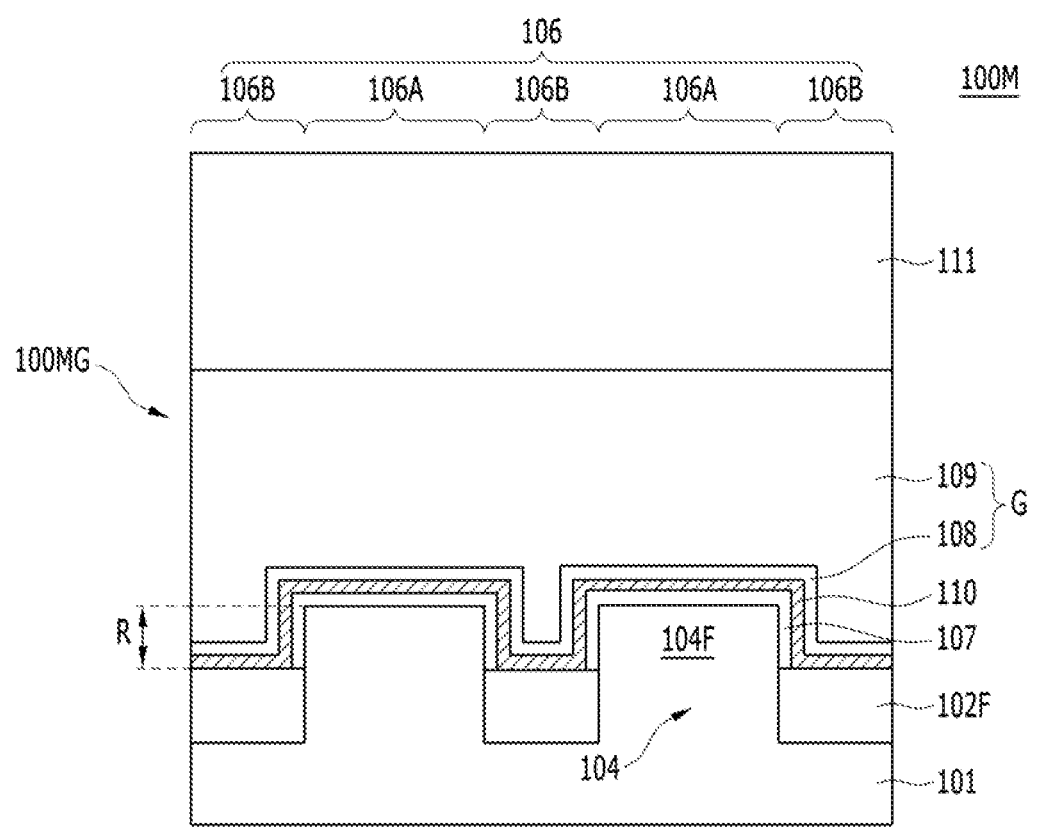

FIGS. 2A and 2B are views illustrating a semiconductor structure in accordance with a modification of the first embodiment. FIG. 2B is a cross-sectional view taken along the line A-A' of FIG. 2A. Referring to FIGS. 2A and 2B, a transistor 120M is shown as a part of a semiconductor structure 100M.

The transistor 120M may be similar to the transistor 120 of FIG. 1A. The transistor 120M may include a buried gate structure 100MG, a first doping region 112, and a second doping region 113. The buried gate structure 100MG may include a gate dielectric layer 107, a dipole induction layer 110, a gate electrode G, and a capping layer 111. The gate electrode G may include a first work function portion 108 and a second work function portion 109. The buried gate structure 100MG may further include a fin region 104F. The fin region 104F may be positioned under the bottom surface of a gate trench 106.

The gate trench 106 may include a first trench 106A and a second trench 106B. The first trench 106A may be formed in an active region 104. The second trench 106B may be formed in an isolation layer 102. The second trench 106B may continuously extend the first trench 106A. The first trench 106A and the second trench 106B may have bottom surfaces which are positioned at different levels. For example, the bottom surface of the first trench 106A may be positioned at a level higher than the bottom surface of the second trench 106B. The height difference between the first trench 106A and the second trench 106B is formed as the isolation layer 102 is recessed. Therefore, the second trench 106B may include a recess region R which has a bottom surface lower than the bottom surface of the first trench 106A. The fin region 104F is formed in the active region 104 due to a step portion between the first trench 106A and the second trench 106B. Accordingly, the active region 104 includes the fin region 104F.

In this way, the fin region 104F is formed under the first trench 106A, and the sidewalls of the fin region 104F are exposed by a recessed isolation layer 102F. The fin region 104F is a portion where a channel is formed. The fin region 104F is also referred to as a saddle fin. By the fin region 104F, a channel width may be increased, and an electrical characteristic may be improved.

Figure 3:
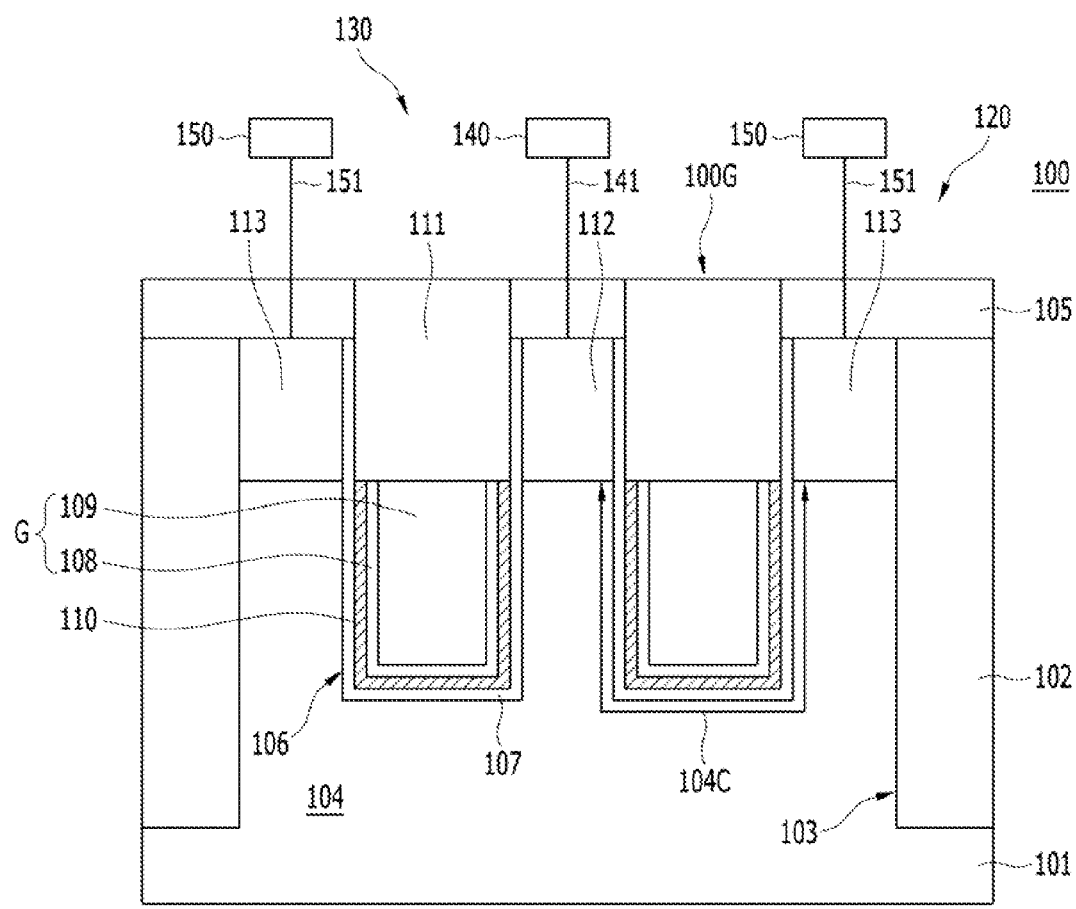
FIG. 3 is a view illustrating an application of the semiconductor structure in accordance with the first embodiment.

FIG. 3 is a view illustrating an application of the semiconductor structure in accordance with the first embodiment. Referring to FIG. 3, a memory cell 130 is shown as a part of a semiconductor structure 100. The memory cell 130 may include a transistor 120, a bit line 140, and a memory element 150. The transistor 120 may be the same as the transistor 120 of FIG. 1A. Accordingly, the transistor 120 may include a buried gate structure 100G, a first doping region 112, and a second doping region 113. The first doping region 112 may be electrically coupled to the bit line 140 through a first contact plug 141. The second doping region 113 may be electrically coupled to the memory element 150 through a second contact plug 151.

The buried gate structure 100G may also be referred to as a buried word line structure (BWL). The buried gate structure 100G may be embedded in a gate trench 106. The buried gate structure 100G may include a gate dielectric layer 107, a dipole induction layer 110, a gate electrode G, and a capping layer 111. The gate electrode G may include a first work function portion 108 and a second work function portion 109. In another embodiment, the transistor 120 may be replaced with the transistor 120M of FIG. 2A.

Figure 4A:
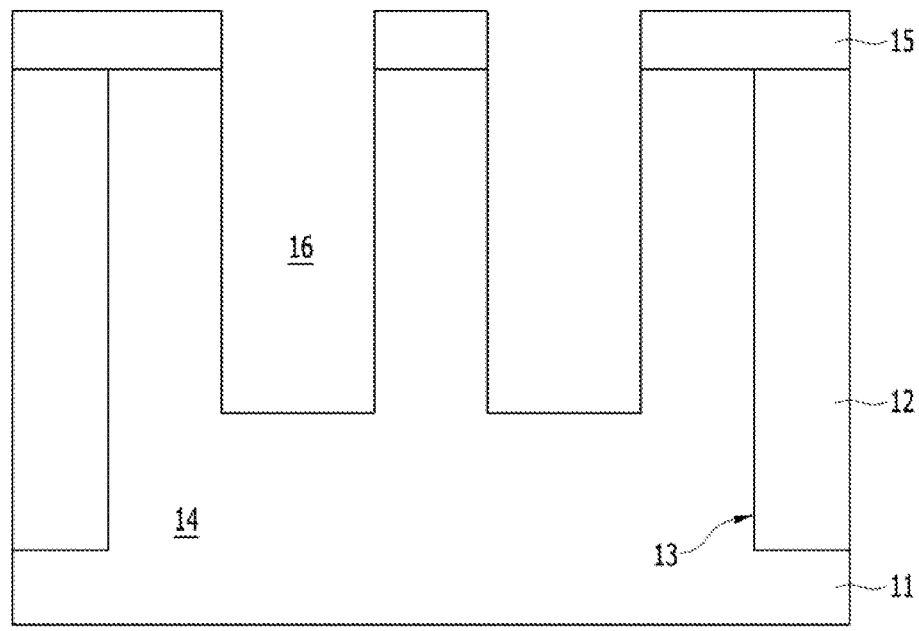
FIGS. 4A to 4F illustrate a method for manufacturing the semiconductor structure in accordance with the first embodiment.

FIGS. 4A to 4F illustrate a method for manufacturing the semiconductor structure in accordance with the first embodiment. As shown in FIG. 4A, an isolation layer 12 is formed in a substrate 11. An active region 14 is defined by the isolation layer 12. The isolation layer 12 may be formed through a shallow trench isolation (STI) process. For example, by etching the substrate 11, an isolation trench 13 is formed. The isolation trench 13 is filled with a dielectric material, and accordingly, the isolation layer 12 is formed. The isolation layer 12 may include silicon oxide, silicon nitride, or a combination thereof. Chemical vapor deposition (CVD) or another deposition process may be used to fill the isolation trench 13 with a dielectric material. A planarization process such as chemical mechanical polishing (CMP) may be additionally used.

A hard mask layer 15 may be formed on the substrate 11. The hard mask layer 15 may be formed of a material which has an etching selectivity with respect to the substrate 11. The hard mask layer 15 may include silicon oxide. The hard mask layer 15 may include silicon oxide such as TEOS. The hard mask layer 15 may be patterned to have a line-shaped opening.

A gate trench 16 is formed in the substrate 11. The gate trench 16 may have a line shape which traverses the active region 14 and the isolation layer 12. The gate trench 16 may be formed by an etching process using the hard mask layer 15 as an etch mask. The gate trench 16 may be formed shallower than the isolation trench 13. The gate trench 16 may have a sufficient depth capable of increasing the average cross-sectional area of a gate electrode to be subsequently formed. According to this fact, the resistivity of the gate electrode may be decreased.

The bottom of the gate trench 16 may be rounded and have a curvature. By forming the bottom of the gate trench 16 to have a curvature, a roughness may be minimized at the bottom of the gate trench 16, and accordingly, filling of the gate electrode may be easily performed. Also, by forming the bottom of the gate trench 16 to have a curvature, angled corners may be removed at the bottom of the gate trench 16, whereby electric field concentration may be reduced.

While not shown, a fin region may be formed. The fin region may be formed by recessing the isolation layer 12 (see FIGS. 2A and 2B).

Figure 4B:
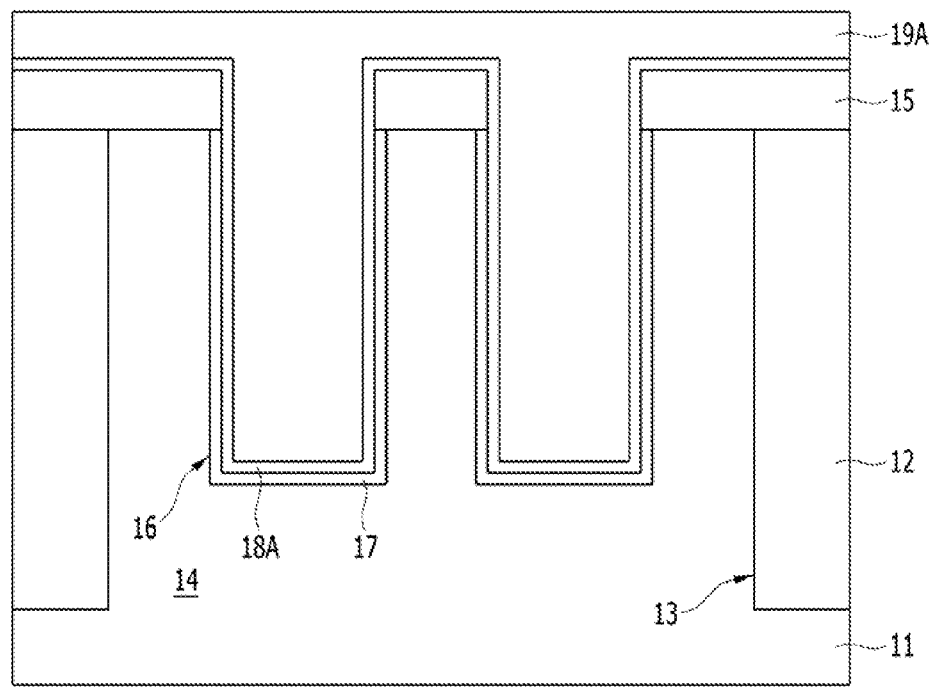

As shown in FIG. 4B, a gate dielectric layer 17 may be formed on the surface of the gate trench 16. Before forming the gate dielectric layer 17, etch damage which might be inflicted to the surface of the gate trench 16 may be recovered. For example, sacrificial oxide may be formed by thermal oxidation processing, and may then be removed.

The gate dielectric layer 17 may be formed by a thermal oxidation process. The gate dielectric layer 17 may be a material which has a higher oxygen areal density smaller than a dipole induction layer which will be subsequently formed. The gate electrode 17 may be silicon oxide. In another embodiment, the gate dielectric layer 17 may be formed by depositing a liner polysilicon layer and then performing radical oxidation of the liner polysilicon layer. In still another embodiment, the gate dielectric layer 17 may be formed by forming a liner silicon nitride layer and then performing radical oxidation of the liner silicon nitride layer.

A first work function layer 18A and a second work function layer 19A may be formed on the gate dielectric layer 17. The second work function layer 19A may fill the gate trench 16 over the gate dielectric layer 17. The first work function layer 18A and the second work function layer 19A may be low resistivity materials. The second work function layer 19A may be formed of a material which has lower resistivity than the first work function layer 18A. The first work function layer 18A and the second work function layer 19A may include metal-containing materials. The second work function layer 19A and the first work function layer 18A may be the same material.

The second work function layer 19A may have a mid-gap work function. The first work function layer 18A and the second work function layer 19A may have the same work function. The first work function layer 18A may have a higher work function than the second work function layer 19A. Namely, the first work function layer 18A may be a high work function material. The second work function layer 19A may include a tungsten layer or titanium nitride. The first work function layer 18A may include titanium nitride (TiN). The first work function layer 18A may include an oxygen-reactable element capable of reacting with oxygen. For example, titanium of the titanium nitride may react with oxygen to form titanium oxide.

Figure 4C:
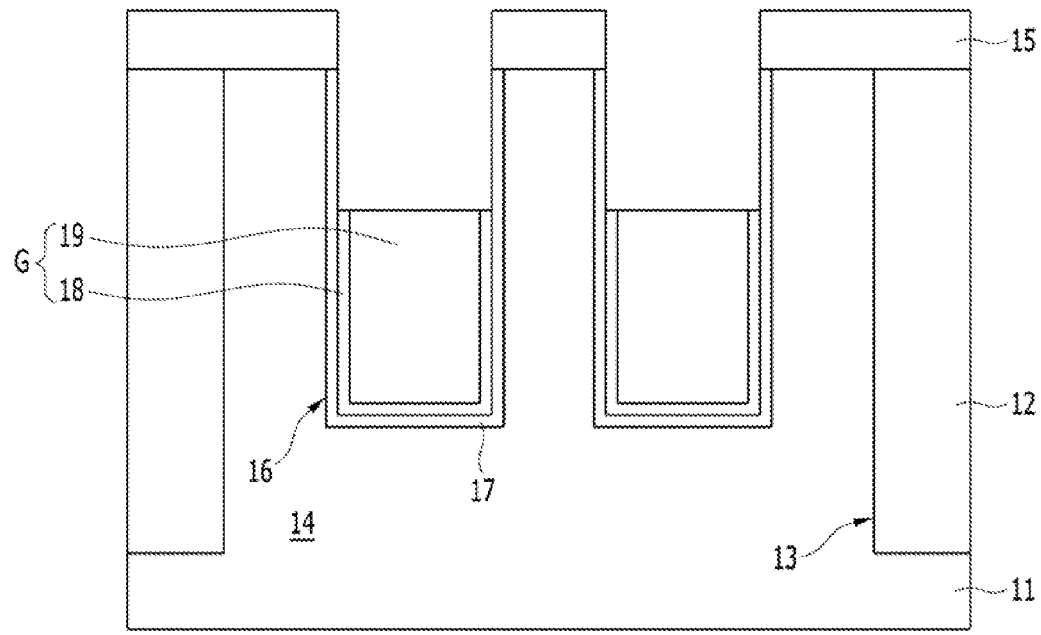

As shown in FIG. 4C, a gate electrode G may be formed. The gate electrode G may include a second work function portion 19 and a first work function portion 18. In order to form the second work function portion 19 and the first work function portion 18, the second work function layer 19A and the first work function layer 18A may be selectively etched. For example, a chemical mechanical process (CMP), an etch-back process, or a combination thereof may be sequentially performed. The top surface of the gate electrode G may be a level lower than the top surface of the active region 14. According to this fact, the gate electrode G may be positioned in the gate trench 16. Such a gate electrode G may be referred to as an embedded gate electrode or a buried gate electrode. The first work function portion 18 may serve as a barrier layer for substantially preventing diffusion of the second work function portion 19.

Figure 4D:
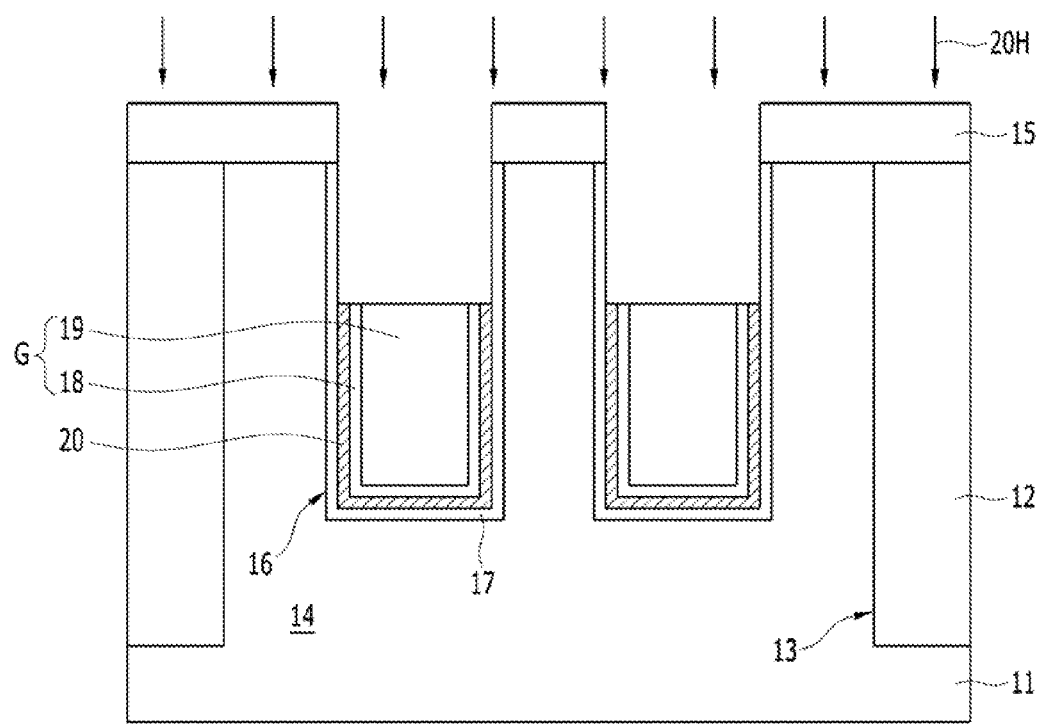

As shown in FIG. 4D, a dipole induction layer 20 may be formed. In order to form the dipole induction layer 20, the gate electrode G may be exposed to a thermal process 20H. The thermal process 20H may include rapid thermal annealing (RTA). The rapid thermal annealing may be performed at a temperature of 800° C. or over. In order to substantially prevent oxidation of the exposed gate electrode G, specifically, the exposed second work function portion 19, the rapid thermal annealing is performed in an oxygen-free atmosphere. The rapid thermal annealing may be performed in a nitrogen ($N_2$) or argon (Ar) atmosphere.

By the thermal process 20H described above, the dipole induction layer 20 may be formed between the gate dielectric layer 17 and the gate electrode G. The dipole induction layer 20 may be formed between the first work function portion 18 and the gate dielectric layer 17. For example, in the case where the first work function portion 18 includes titanium nitride, titanium oxide ($TiO_2$) may be formed when the titanium of the titanium nitride and oxygen of the gate dielectric layer 17 react with each other. The titanium oxide ($TiO_2$) may become the dipole induction layer 20.

An oxygen concentration or ratio in the dipole induction layer 20 may be higher than the oxygen concentration or ratio of the gate dielectric layer 17. For example, an oxygen areal density of the titanium oxide is higher than the oxygen areal density of silicon oxide. Thus, oxygen in the titanium oxide diffuses into silicon oxide. In other words, as $O_2$— ions diffuse from the titanium oxide into silicon oxide, the titanium oxide is positively charged, and silicon oxide is negatively charged. Accordingly, a dipole is formed.

The dipole lowers the energy band of the gate electrode G, specifically, the first work function portion 18. As a result, the first work function portion 18 has an increased work function. Consequently, the effective work function of the gate electrode G increases, and a threshold voltage may be adjusted.

In this way, as the dipole is formed, the amount of a dopant in the substrate 11, that is, a channel region, may be decreased. Due to this fact, issues caused by a high electric field may be suppressed. Consequently, the reliability of a transistor may be improved, and the refresh characteristic of a DRAM may be improved.

The thickness of the dipole induction layer 20 may be increased as the temperature of the thermal process 20H is raised, and accordingly, the effective work function of the gate electrode G may be further increased. Furthermore, since the dipole induction layer 20 is formed by the thermal process 20H after the gate electrode G is formed, even though the thickness of the dipole induction layer 20 is increased, an influence is not exerted on the filling characteristic of the gate electrode G. As a comparative example, in the case where work function layers used as a gate electrode are filled after depositing a dipole induction layer, the filling characteristic of the work function layers may deteriorate due to the thickness of the dipole induction layer.

As described above, since the effective work function of the gate electrode G may be increased due to the thermal process 20H, the filling characteristic of the gate electrode G may be improved. That is, since it is not necessary to additionally form a high work function material layer to increase the effective work function of the gate electrode G, an aspect ratio does not increase. Furthermore, due to the thermal process 20H, the specific resistivity of the second work function portion 19 may be decreased, and thus RC delay may be improved.

Figure 4E:
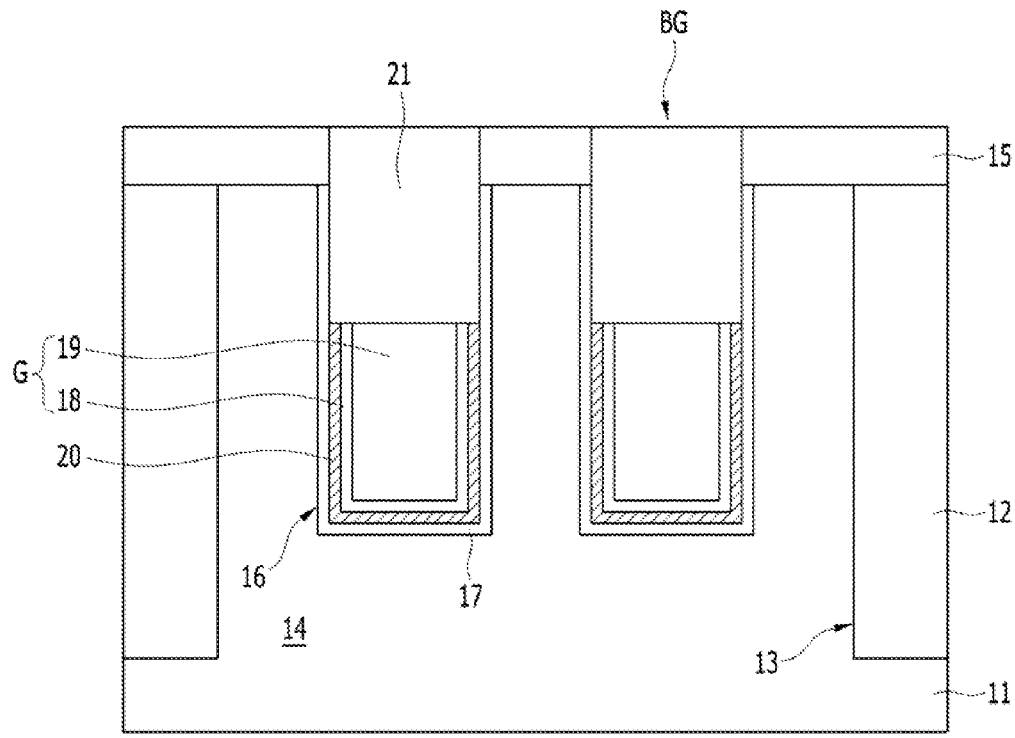

As shown in FIG. 4E, a capping layer 21 is formed on the gate electrode G. The capping layer 21 includes a dielectric material. On the gate electrode G, the gate trench 16 is filled with the capping layer 21. The capping layer 21 may include silicon nitride. Subsequently, planarization of the capping layer 21 may be performed such that the top surface of the substrate 11 is exposed. In another embodiment, the capping layer 21 may include silicon oxide. In still another embodiment, the capping layer 21 may be a nitride-oxide-nitride (NON) structure.

By forming the capping layer 21, a buried gate structure BG is formed. The buried gate structure BG includes the gate dielectric layer 17, the dipole induction layer 20, the gate electrode G, and the capping layer 21. The gate electrode G may include the first work function portion 18 and the second work function portion 19. The dipole induction layer 20 may be positioned between the first work function portion 18 and the gate dielectric layer 17. The top surface of the gate electrode G is positioned at a lower level than the top surface of the substrate 11. In this way, as the top surface of the gate electrode G is recessed, the physical distance between the gate electrode G and a nearby conductor for example, a contact plug may be sufficiently secured. As a result, a withstand-voltage between the gate electrode G and the nearby conductor may be improved.

Figure 4F:
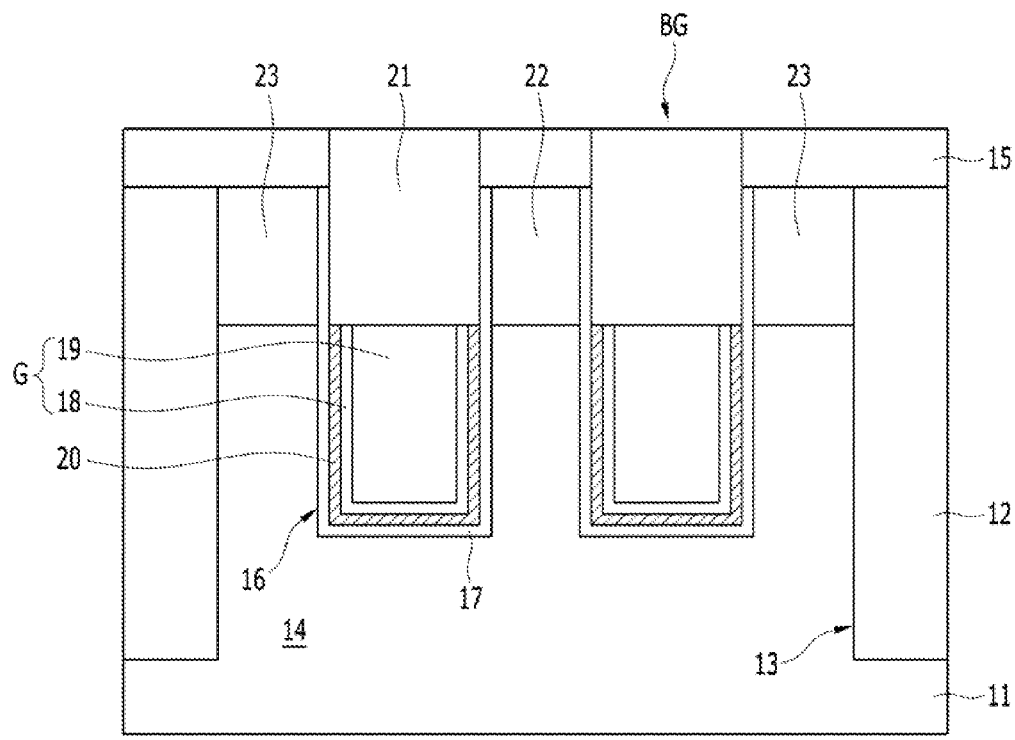

As shown in FIG. 4F, a first doping region 22 and a second doping region 23 may be formed in the active region 14. The first doping region 22 and the second doping region 23 may be formed on both sides of the buried gate structure BG. The first doping region 22 and the second doping region 23 may be formed by a doping process such as implantation. The first doping region 22 and the second doping region 23 may have such a depth that they do not overlap the gate electrode G. The dipole induction layer 20 and the first work function portion 18 may not overlap with the first and second doping regions 22 and 23. Accordingly, GIDL may be improved.

Figure 5A:
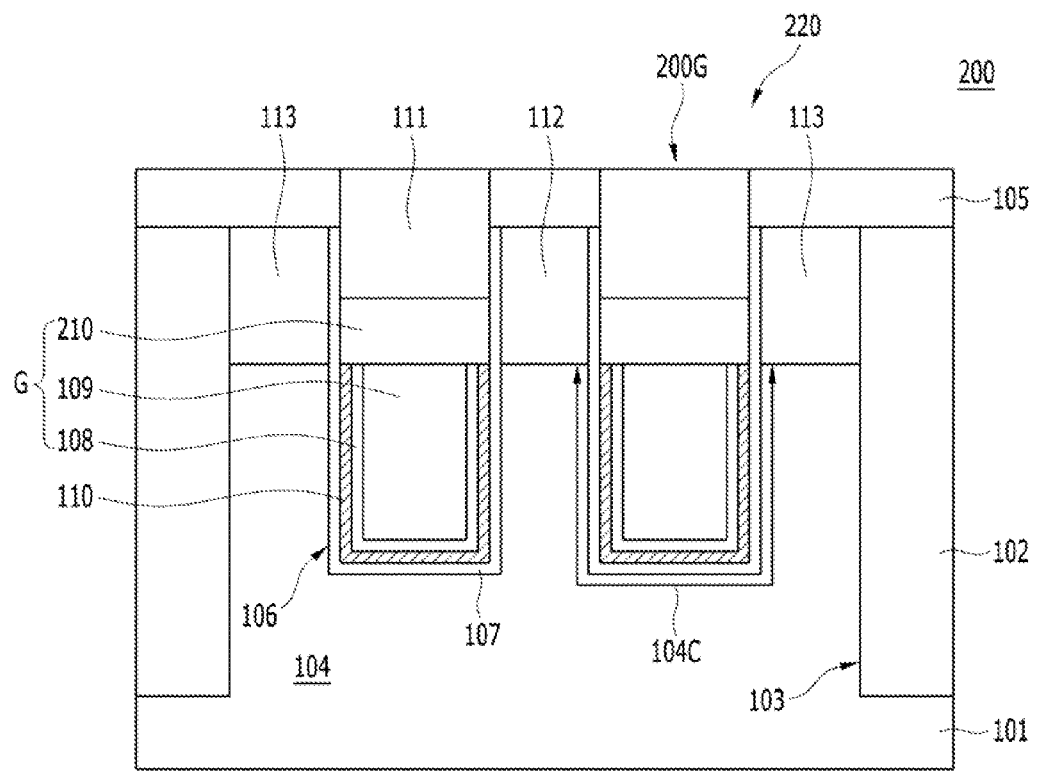
FIG. 5A is a view illustrating a semiconductor structure in accordance with a second embodiment.
Figure 5B:
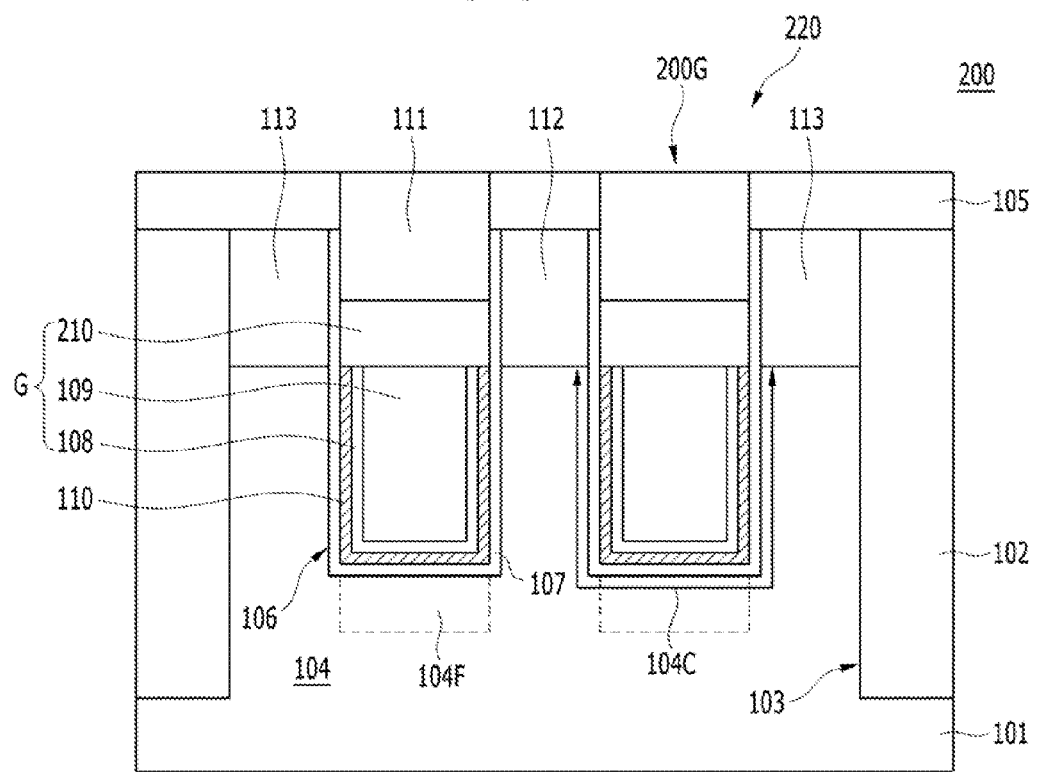
FIG. 5B is a view illustrating a semiconductor structure in accordance with a modification of the second embodiment.

FIG. 5A is a view illustrating a semiconductor structure in accordance with a second embodiment. FIG. 5B is a view illustrating a semiconductor structure in accordance with a modification of the second embodiment.

Referring to FIGS. 5A and 5B, a transistor 220 is shown as a part of a semiconductor structure 200. The transistor 220 may be similar to the transistor 120 of FIG. 1A. The transistor 220 may include a buried gate structure 200G, a first doping region 112, and a second doping region 113. The buried gate structure 200G may include a gate dielectric layer 107, a dipole induction layer 110, a gate electrode G, and a capping layer 111. The gate electrode G may include a first work function portion 108, a second work function portion 109, and a third work function portion 210. The buried gate structure 200G may further include a fin region 104F. See FIG. 5B.

The third work function portion 210 may have a work function lower than the first work function portion 108. The third work function portion 210 may have an N type work function. The third work function portion 210 may have a work function lower than the mid-gap work function of silicon. The third work function portion 210 may include polysilicon which is doped with an N type dopant. The third work function portion 210 may overlap with the first doping region 112 and the second doping region 113. By the third work function portion 210 having a low work function, gate-induced drain leakage (GIDL) may be improved. While not shown, a barrier may be additionally formed between the third work function portion 210 and the second work function portion 109. The barrier may be extended to a position between the first work function portion 108 and the third work function portion 210. Additionally, the barrier may be extended to a position between the third work function portion 210 and the dipole induction layer 110. The barrier may include titanium nitride.

Figure 5C:
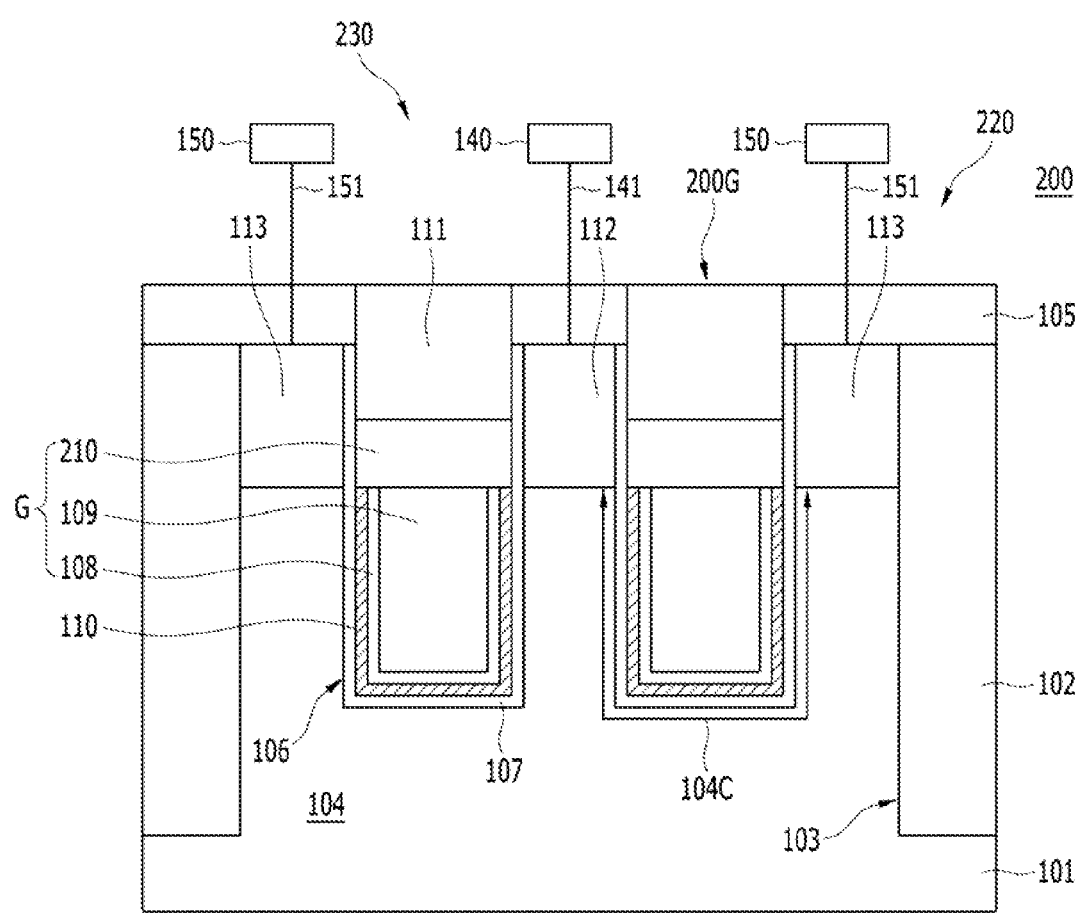
FIG. 5C is a view illustrating an application of the semiconductor structure in accordance with the second embodiment.

FIG. 5C is a view illustrating an application of the semiconductor structure in accordance with the second embodiment. Referring to FIG. 5C, a memory cell 230 is a part of a semiconductor structure 200. The memory cell 230 may include a transistor 220, a bit line 140, and a memory element 150. The transistor 220 may be the same as the transistor 220 shown in FIG. 5A. Accordingly, the transistor 220 may include a buried gate structure 200G, a first doping region 112, and a second doping region 113. The first doping region 112 may be electrically coupled to the bit line 140 through a first contact plug 141. The second doping region 113 may be electrically coupled to the memory element 150 through a second contact plug 151.

The buried gate structure 200G may also be referred to as a buried word line structure (BWL). The buried gate structure 200G may be embedded in a gate trench 106. The buried gate structure 200G may include a gate dielectric layer 107, a dipole induction layer 110, a gate electrode G, and a capping layer 111. The gate electrode G may include a first work function portion 108 and a second work function portion 109. The gate electrode G may further include a third work function portion 210 which overlaps with the first doping region 112 and the second doping region 113.

FIGS. 6A to 6G illustrate a method for manufacturing the semiconductor structure in accordance with the second embodiment. The manufacturing method according to the second embodiment may be similar to the manufacturing method according to the first embodiment.

Figure 6A:
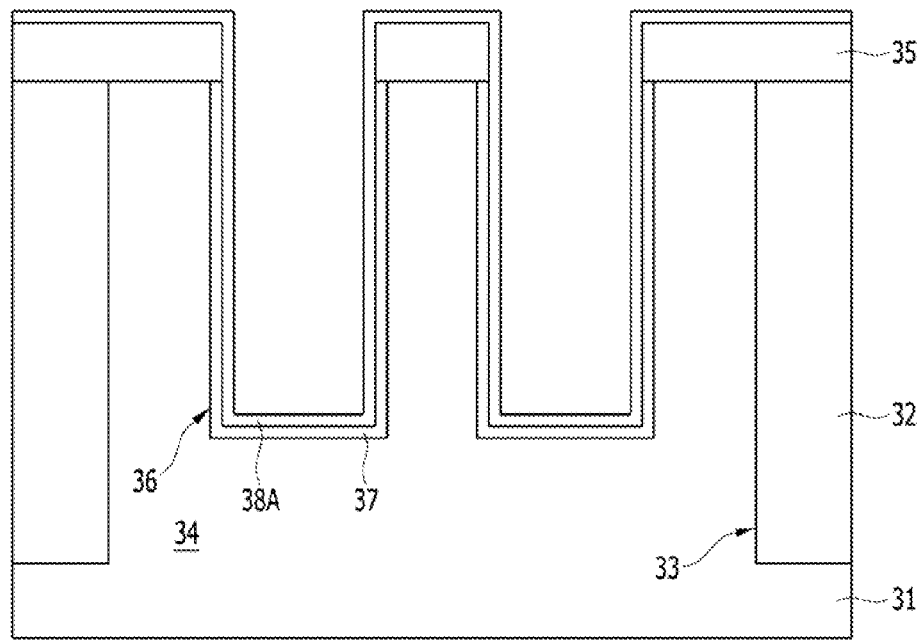
FIGS. 6A to 6G illustrate a method for manufacturing the semiconductor structure in accordance with the second embodiment.

As shown in FIG. 6A, an isolation layer 32 is formed in a substrate 31. The isolation layer 32 may be filled in an isolation trench 33. An active region 34 is defined by the isolation layer 32. A hard mask layer 35 may be formed on the substrate 31. The hard mask layer 35 may include silicon oxide. The hard mask layer 35 may include TEOS. The hard mask layer 35 may be patterned to have a line-shaped opening.

A gate trench 36 is formed in the substrate 31. The gate trench 36 may have a line shape which traverses the active region 34 and the isolation layer 32. While not shown, a fin region may be formed.

A gate dielectric layer 37 may be formed on the surface of the gate trench 36. The gate dielectric layer 37 may be formed by a thermal oxidation process. The gate dielectric layer 37 may be a material which has an oxygen areal density smaller than a dipole induction layer which will be subsequently formed. The gate dielectric layer 37 may be silicon oxide. A first work function layer 38A may be formed on the gate dielectric layer 37. The first work function layer 38A may include titanium nitride (TiN) or tantalum nitride (TaN).

Figure 6B:
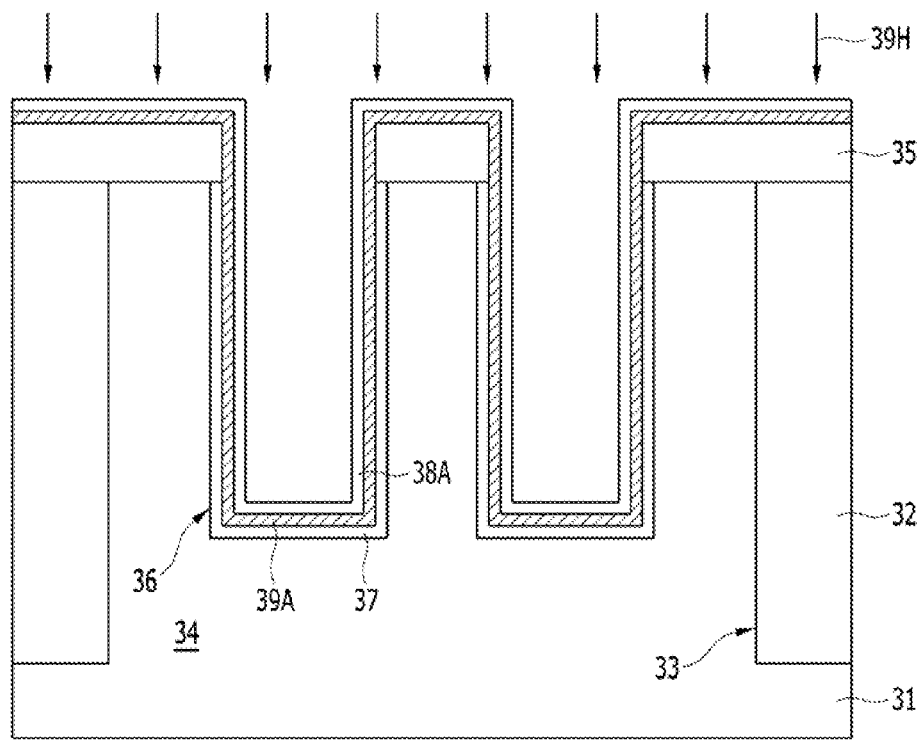

As shown in FIG. 6B, a dipole induction layer 39A may be formed. In order to form the dipole induction layer 39A, the first work function layer 38A may be exposed to a thermal process 39H. The thermal process 39H may include rapid thermal annealing (RTA). The rapid thermal annealing is performed at a temperature of 800° C. or over, and is performed in a nitrogen (N) or argon (Ar) atmosphere.

By the thermal process 39H described above, the dipole induction layer 39A may be formed between the gate dielectric layer 37 and the first work function layer 38A. For example, in the case where the first work function layer 38A includes titanium nitride, titanium oxide may be formed as a portion of the titanium nitride is oxidated. The titanium oxide may become the dipole induction layer 39A. The dipole induction layer 39A may also cover the sidewalls and top surface of the hard mask layer 35.

Figure 6C:
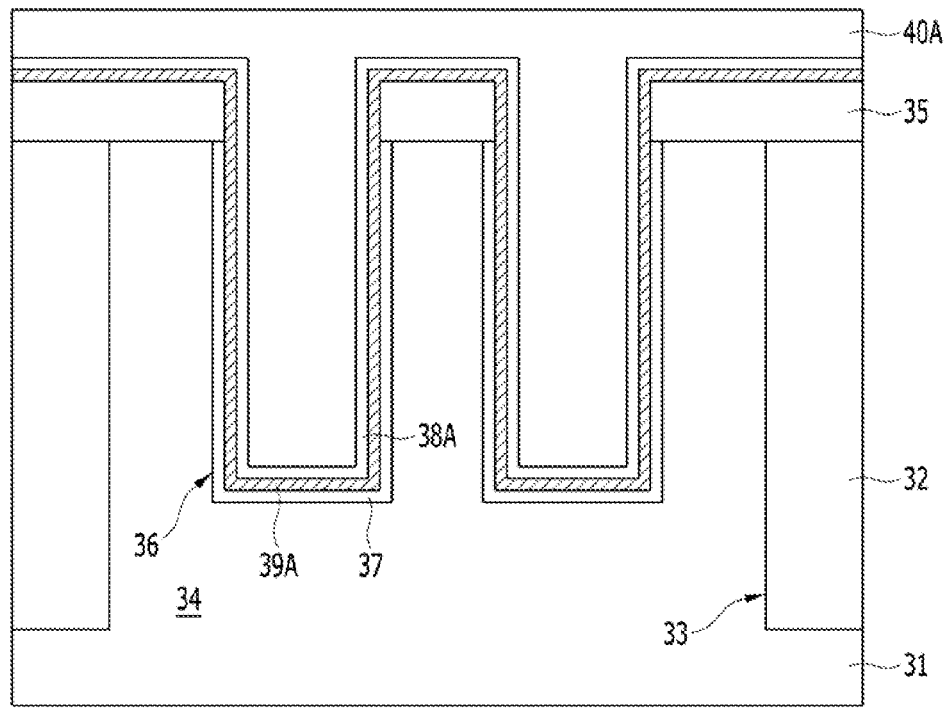

As shown in FIG. 6C, a second work function layer 40A may be formed. The second work function layer 40A may fill the gate trench 36 on the first work function layer 38A. The second work function layer 40A may have a mid-gap work function. The second work function layer 40A may be formed of a low resistivity material. The second work function layer 40A may include a low resistivity metal. The second work function layer 40A may include a tungsten layer.

Figure 6D:
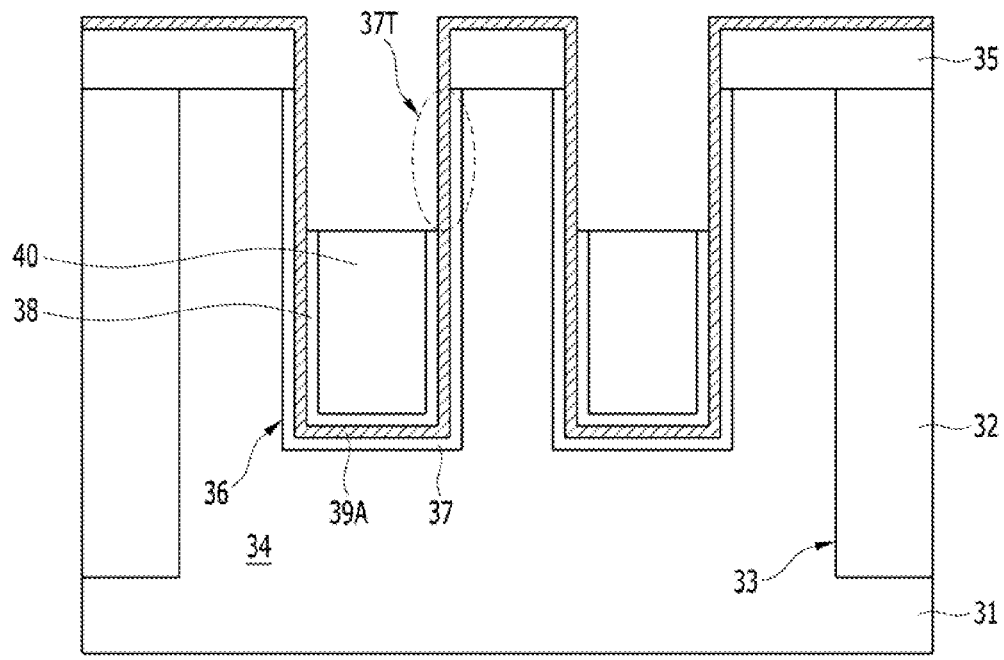

As shown in FIG. 6D, a second work function portion 40 and a first work function portion 38 may be formed. In order to form the second work function portion 40 and the first work function portion 38, the second work function layer 40A and the first work function layer 38A may be etched by an etch-back process. The top surfaces of the second work function portion 40 and the first work function portion 38 may be at a level lower than the top surface of the active region 34.

While etching back the second work function layer 40A and the first work function layer 38A, the gate dielectric layer 37 may be substantially prevented from being damaged by the dipole induction layer 39A. See the reference symbol 37T.

Figure 6E:
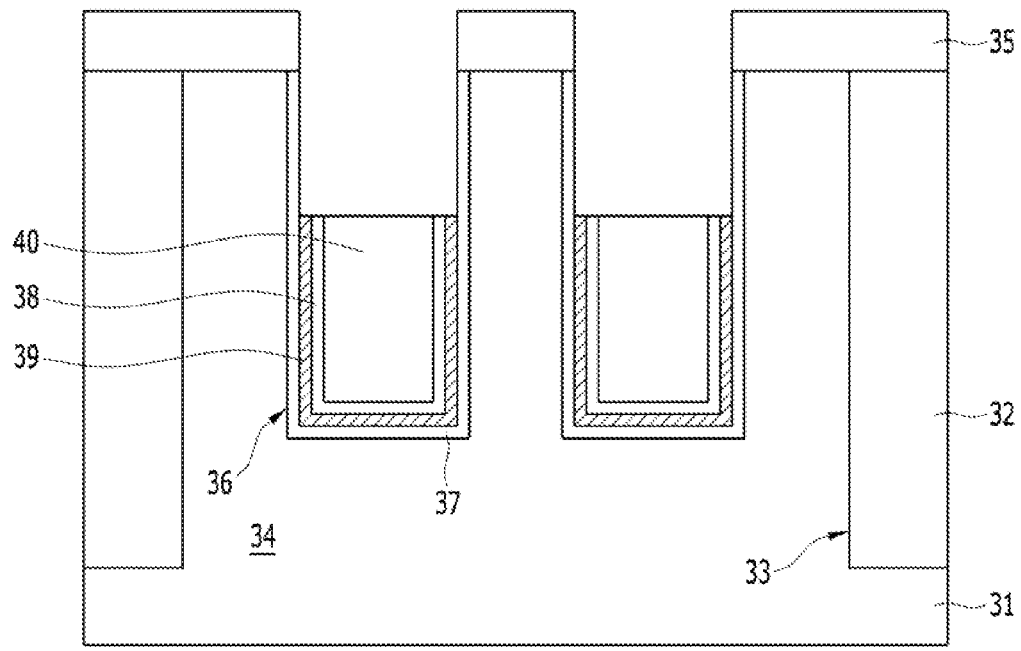

As shown in FIG. 6E, exposed portions of the dipole induction layer 39A may be removed selectively. Accordingly, a dipole induction layer 39 may remain in the gate trench 36. The top surface of the dipole induction layer 39 may be at the same level as the top surfaces of the second work function portion 40 and the first work function portion 38.

Figure 6F:
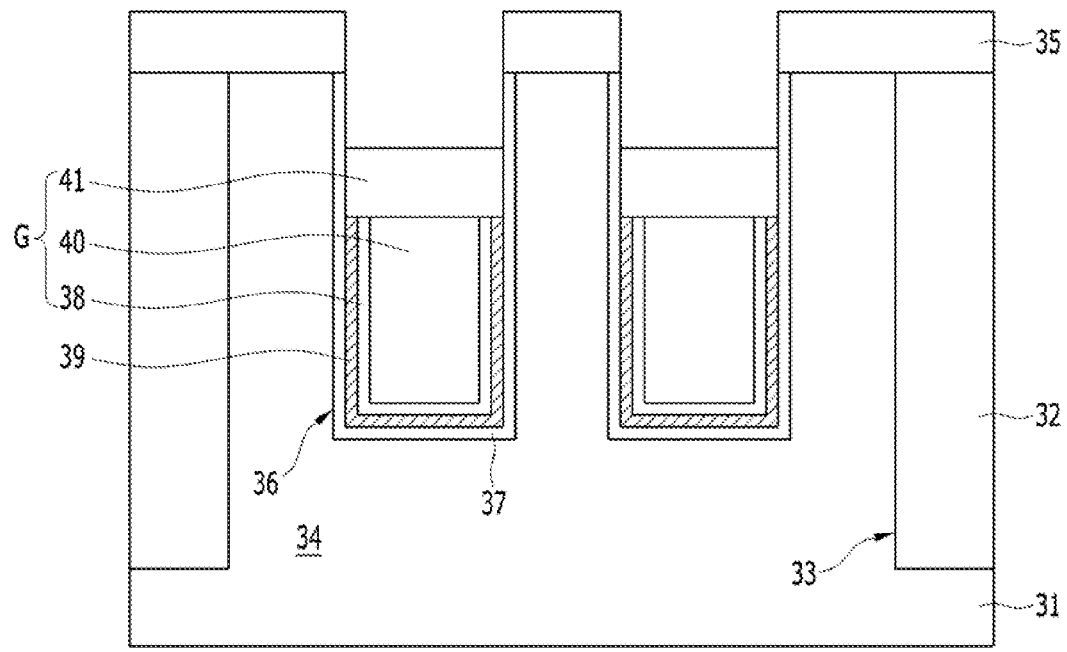

As shown in FIG. 6F, a third work function portion 41 may be formed. The third work function portion 41 may be formed by filling a third work function layer (not numbered) and then performing a recessing process. The third work function portion 41 includes a low work function material. The third work function portion 41 may be formed of a non-metallic material having conductivity. The third work function portion 41 may include polysilicon which is doped with an N type impurity. The top surface of the third work function portion 41 may be at a level lower than the top surface of the active region 34.

In this way, by forming the third work function portion 41, a gate electrode G may be formed in the gate trench 36. The gate electrode G may include the first work function portion 38, the second work function portion 40, and the third work function portion 41. The dipole induction layer 39 may be positioned between the first work function portion 38 and the gate dielectric layer 37.

Figure 6G:
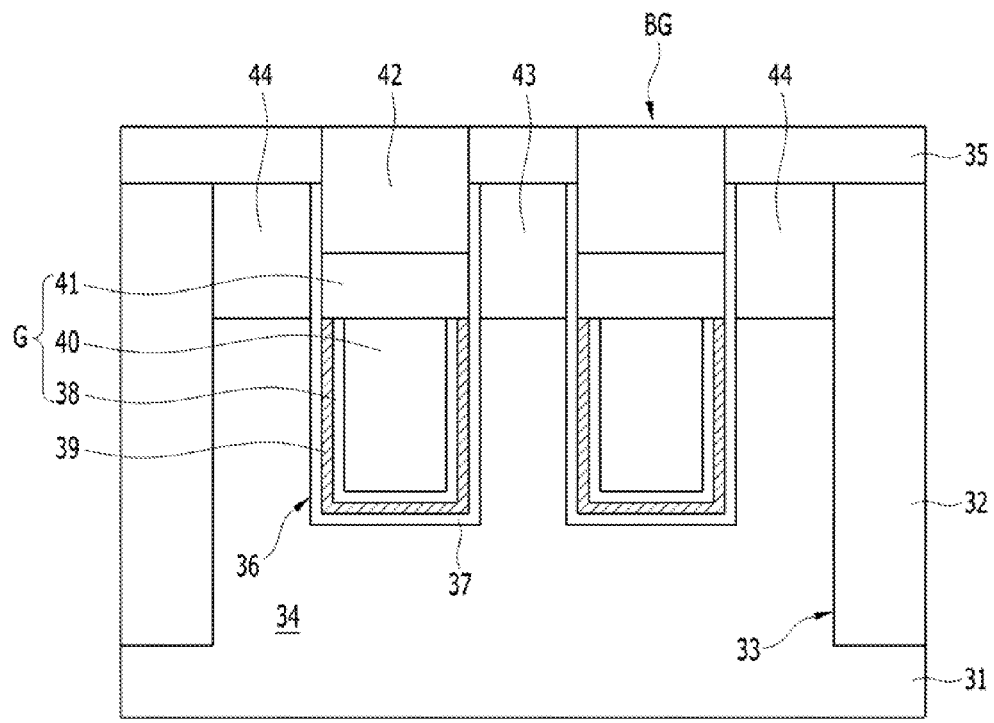

As shown in FIG. 6G, a capping layer 42 is formed on the third work function portion 41. The capping layer 42 includes a dielectric material. On the third work function portion 41, the gate trench 36 is filled with the capping layer 42. The capping layer 42 may include silicon nitride. Subsequently, planarization of the capping layer 42 may be performed such that the top surface of the hard mask layer 35 is exposed.

By the above-described series of processes, a buried gate structure BG is formed. The buried gate structure BG includes the gate dielectric layer 37, the dipole induction layer 39, the first work function portion 38, the second work function portion 40, the third work function portion 41, and the capping layer 42.

After forming the capping layer 42, a doping process of an impurity is performed by implantation or another doping technology. Accordingly, a first doping region 43 and a second doping region 44 are formed in the substrate 31. When performing the doping process of the impurity, the capping layer 42 is used as a barrier. The first doping region 43 and the second doping region 44 may be referred to as a source region and a drain region, respectively. The first doping region 43 and the second doping region 44 may have such a depth that each of the first doping region 43 and the second doping region 44 overlaps with the third work function portion 41.

Figure 7A:
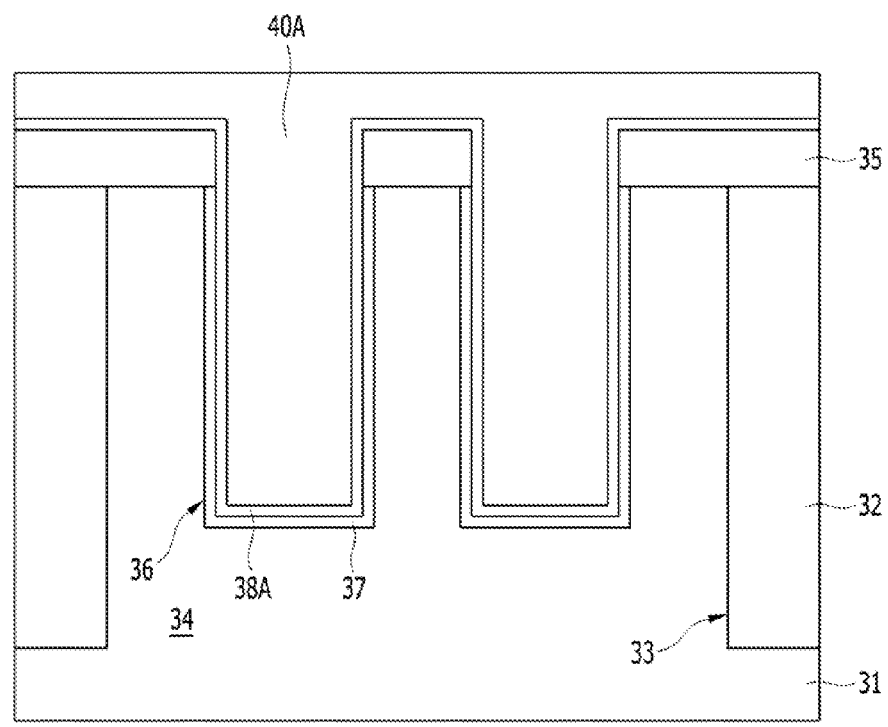
FIGS. 7A to 7G illustrate another method for manufacturing the semiconductor structure in accordance with the second embodiment.

FIGS. 7A to 7G illustrate another method for manufacturing the semiconductor structure in accordance with the second embodiment. As shown in FIG. 7A, an isolation layer 32 is formed in a substrate 31. The isolation layer 32 may be filled in an isolation trench 33. An active region 34 is defined by the isolation layer 32.

A hard mask layer 35 may be formed on the substrate 31. The hard mask layer 35 may include silicon oxide. The hard mask layer 35 may include TEOS. The hard mask layer 35 may be patterned to have a line-shaped opening. A gate trench 36 is formed in the substrate 31. The gate trench 36 may have a line shape which traverses the active region 34 and the isolation layer 32.

A gate dielectric layer 37 may be formed on the surface of the gate trench 36. The gate dielectric layer 37 may be formed by a thermal oxidation process. The gate dielectric layer 37 may be a material which has an oxygen ratio per unit volume smaller than a dipole induction layer to be subsequently formed. The gate dielectric layer 37 may be silicon oxide.

A first work function layer 38A may be formed on the gate dielectric layer 37. The first work function layer 38A may include titanium nitride (TiN) or tantalum nitride (TaN). A second work function layer 40A may be formed. The second work function layer 40A may fill the gate trench 36 on the first work function layer 38A. The second work function layer 40A may include a tungsten layer.

Figure 7B:
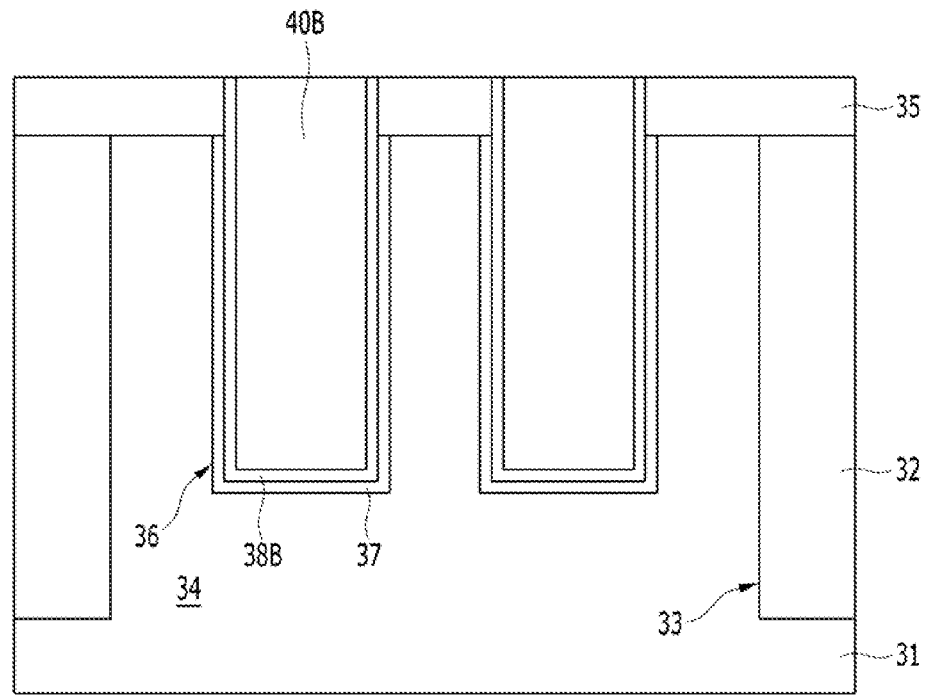

As shown in FIG. 7B, a pre-second work function portion 40B and a pre-first work function portion 38B may be formed. In order to form the pre-second work function portion 40B and the pre-first work function portion 38B, a CMP process may be performed for the second work function layer 40A and the first work function layer 38A. The CMP process may be performed until the surface of the hard mask layer 35 is exposed.

Figure 7C:
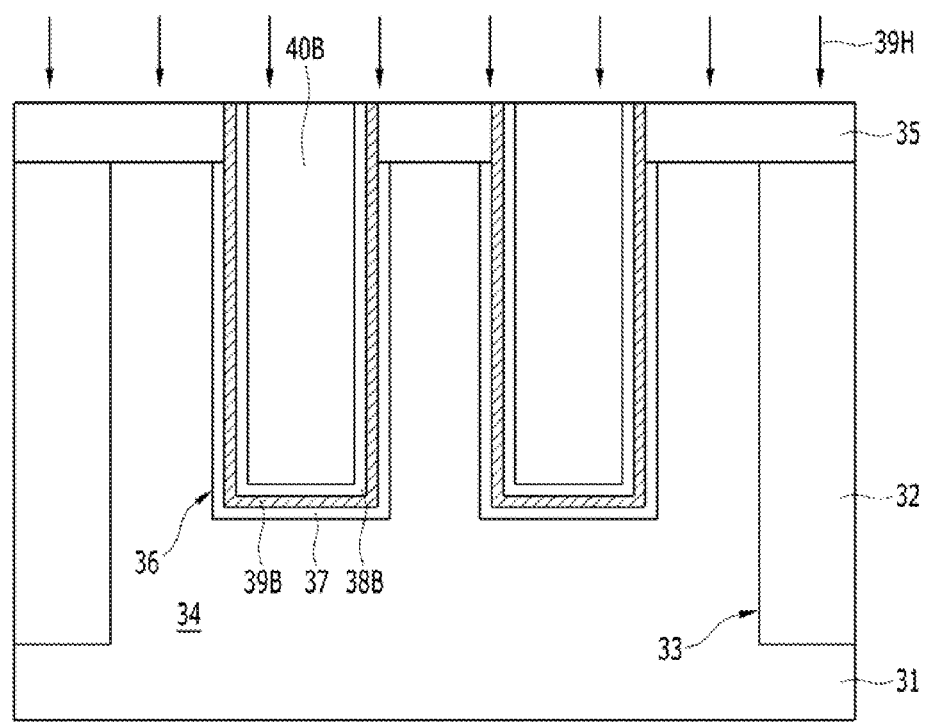

As shown in FIG. 7C, a dipole induction layer 39B may be formed. In order to form the dipole induction layer 39B, the pre-first work function portion 38B may be exposed to a thermal process 39H. The thermal process 39H may include rapid thermal annealing (RTA). The rapid thermal annealing is performed at a temperature of 800° C. or higher, and is performed in a nitrogen (N) or argon (Ar) atmosphere.

By the thermal process 39H described above, the dipole induction layer 39B may be formed between the gate dielectric layer 37 and the pre-first work function portion 38B. For example, in the case where the pre-first work function portion 38B includes titanium nitride, titanium oxide may be formed as a portion of the titanium nitride is oxidated. The titanium oxide may become the dipole induction layer 39B. The dipole induction layer 39B may also cover the sidewalls of the hard mask layer 35.

Figure 7D:
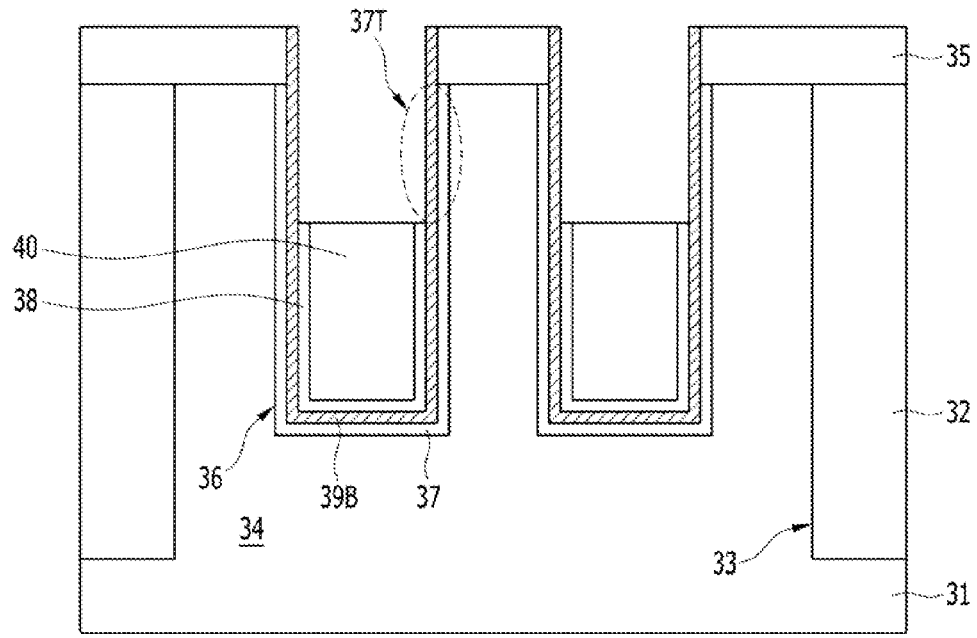

As shown in FIG. 7D, a second work function portion 40 and a first work function portion 38 may be formed. In order to form the second work function portion 40 and the first work function portion 38, the pre-second work function portion 40B and the pre-first work function portion 38B may be etched by an etch-back process. The top surfaces of the second work function portion 40 and the first work function portion 38 may be at a level lower than the top surface of the active region 34.

While etching back the pre-second work function portion 40B and the pre-first work function portion 38B, the gate dielectric layer 37 may be substantially prevented from being damaged, by the dipole induction layer 39B (see the reference symbol 37T).

Figure 7E:
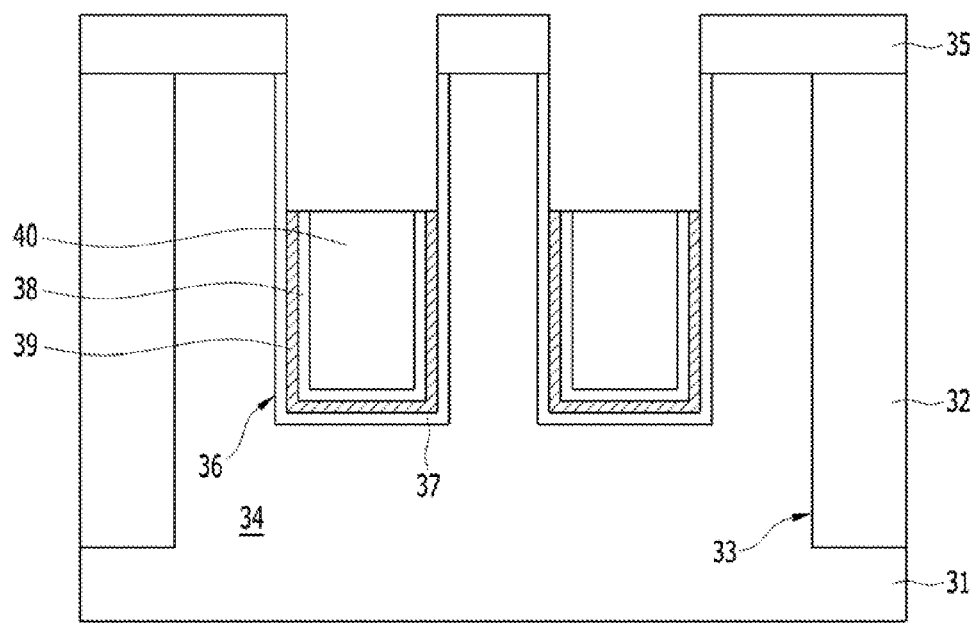

As shown in FIG. 7E, exposed portions of the dipole induction layer 39B may be removed selectively. Accordingly, a dipole induction layer 39 may remain in the gate trench 36. The top surface of the dipole induction layer 39 may be at the same level as the top surfaces of the second work function portion 40 and the first work function portion 38.

Figure 7F:
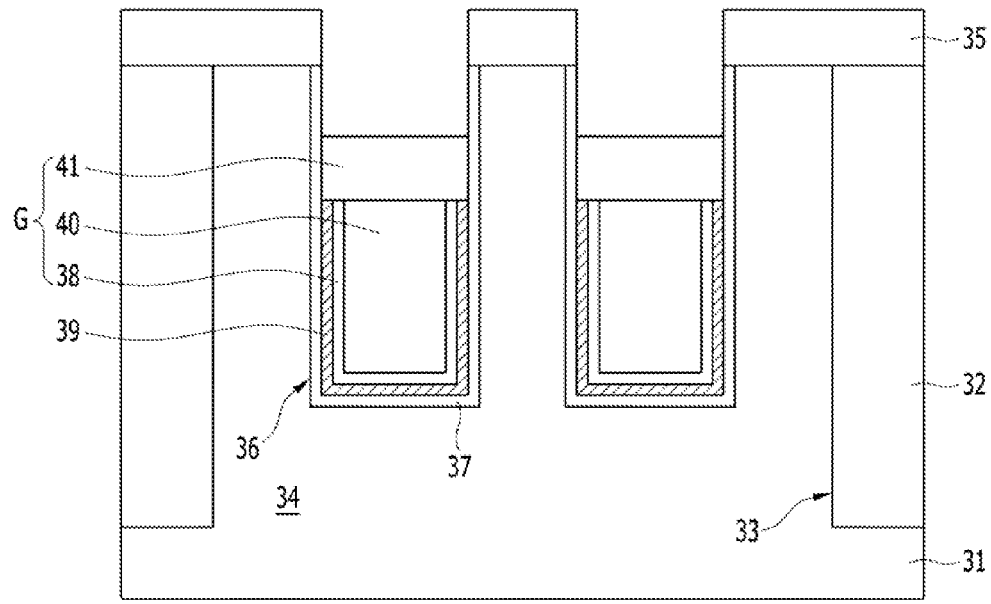

As shown in FIG. 7F, a third work function portion 41 may be formed. The third work function portion 41 may be formed by filling a third work function layer (not numbered) and then performing a recessing process. The third work function portion 41 includes a low work function material. The third work function portion 41 may be formed of a non-metallic material having conductivity. The third work function portion 41 may include polysilicon which is doped with an N type impurity. The third work function portion 41 may be at a level lower than the top surface of the active region 34.

By forming the third work function portion 41, a gate electrode G may be formed in the gate trench 36. The gate electrode G may include the first work function portion 38, the second work function portion 40, and the third work function portion 41. The dipole induction layer 39 may be positioned between the first work function portion 38 and the gate dielectric layer 37.

Figure 7G:
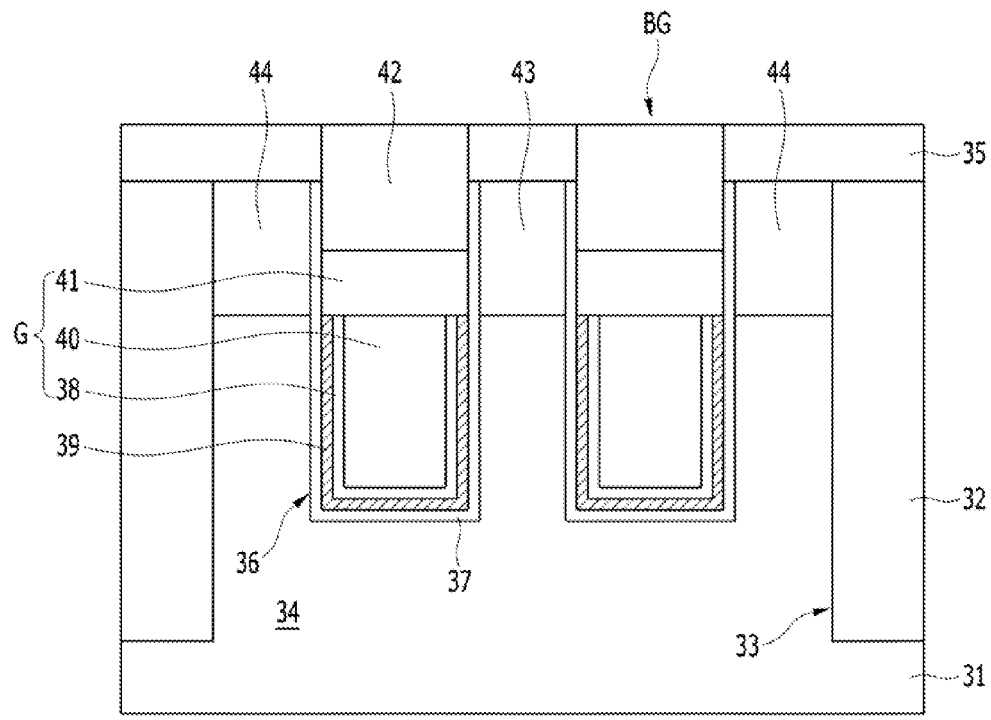

As shown in FIG. 7G, a capping layer 42 is formed on the third work function portion 41. The capping layer 42 includes a dielectric material. On the third work function portion 41, the gate trench 36 is filled with the capping layer 42. The capping layer 42 may include silicon nitride. Subsequently, planarization of the capping layer 42 may be performed such that the top surface of the hard mask layer 35 is exposed. By the above-described series of processes, a buried gate structure BG is formed. The buried gate structure BG includes the gate dielectric layer 37, the dipole induction layer 39, the first work function portion 38, the second work function portion 40, the third work function portion 41, and the capping layer 42.

After forming the capping layer 42, a doping process of an impurity is performed by implantation or another doping technology. Accordingly, a first doping region 43 and a second doping region 44 are formed in the substrate 31. When performing the doping process of the impurity, the capping layer 42 is used as a barrier. The first doping region 43 and the second doping region 44 may be referred to as a source region and a drain region, respectively. Each of the first doping region 43 and the second doping region 44 may overlap with the third work function portion 41.

The semiconductor structures according to the above-described embodiments may be applied to a DRAM (dynamic random access memory), and may also be applied to a memory such as an SRAM (static random access memory), a flash memory, an FeRAM (ferroelectric random access memory), an MRAM (magnetic random access memory), and a PRAM (phase change random access memory), but is not limited thereto.

The semiconductor structures according to the above-described embodiments may be applied to an electronic device. The electronic device may include a plurality of semiconductor devices, and the semiconductor devices may include transistors. At least one semiconductor device among the semiconductor devices included in the electronic device includes a buried gate structure which is formed in a gate trench. The buried gate structure may include a dipole induction layer and a gate electrode. The gate electrode may include a first work function portion and a second work function portion. The dipole induction layer may include titanium oxide, and the first work function portion may include titanium nitride. The second work function portion may include tungsten. A threshold voltage may be easily adjusted by the dipole induction layer. Accordingly, the electronic device may achieve a high operation speed in relation to miniaturization.

In the embodiments, since a dipole induction layer is formed after filling a material for constructing a gate electrode, filling of the gate electrode may be improved.

Also, in the embodiments, loss of a gate dielectric layer which overlaps with doping regions may be substantially prevented by the dipole induction layer.

Further, in the embodiments, since the dipole induction layer which induces a high work function is formed between a channel region and the gate electrode, a channel dose may be decreased, and junction leakage may be reduced.

Moreover, in the embodiments, since a low work function material is formed between the gate electrode and the doping regions, gate-induced drain leakage (GIDL) may be reduced.

Although various embodiments have been described for illustrative purposes, it will be apparent to those skilled in the art that various changes and modifications may be made without departing from the spirit and scope of the invention as defined in the following claims.

What is claimed is:

1. A method for forming a semiconductor structure, comprising:
   forming a trench in a semiconductor substrate;
   forming a gate dielectric layer over a bottom surface and sidewalls of the trench;
   forming a work function layer over the gate dielectric layer;
   recessing the work function layer to form a gate electrode which is recessed in the trench; and
   exposing the gate electrode to a thermal process to form a dipole induction layer between the gate electrode and the gate dielectric layer,
   wherein an oxygen areal density of the dipole induction layer is higher than an oxygen areal density of the gate dielectric layer.

2. The method according to claim 1, wherein the thermal process is performed in an oxygen-free atmosphere.

3. The method according to claim 1, wherein the forming of the dipole induction layer is performed by rapid thermal annealing.

4. The method according to claim 3, wherein the rapid thermal annealing is performed in a nitrogen or argon atmosphere.

5. The method according to claim 1, wherein the work function layer and the dipole induction layer includes same metal atom.

6. The method according to claim 1, wherein the work function layer comprises a metal-base material, and the dipole induction layer comprises oxide which contains a metal of the metal-base material.

7. The method according to claim 1, wherein the work function layer comprises titanium nitride, and
   wherein the dipole induction layer comprises titanium oxide.

8. A method for forming a semiconductor structure, comprising:
   forming a trench in a semiconductor substrate;
   forming a gate dielectric layer over a bottom surface and sidewalls of the trench;
   forming a work function layer over the gate dielectric layer;
   recessing the work function layer to form a gate electrode which is recessed in the trench; and
   exposing the gate electrode to a thermal process to form a dipole induction layer between the gate electrode and the gate dielectric layer,
   wherein the forming of the work function layer comprises:
   forming conformally a first work function layer over the gate dielectric layer; and
   filling a second work function layer over the first work function layer,
   wherein the dipole induction layer is formed by a reaction of a portion of the first work function layer and a portion of the gate dielectric layer.

9. The method according to claim 8, wherein the first work function layer comprises titanium nitride, and
   wherein the second work function layer comprises tungsten.

10. The method according to claim 8, wherein each of the first work function layer and the second work function layer comprises titanium nitride.

11. The method according to claim 1, wherein the gate dielectric layer comprises silicon oxide, wherein the work function layer comprises titanium nitride, and wherein the dipole induction layer comprises titanium oxide.

12. A method for forming a semiconductor structure, comprising:
- forming a trench in a semiconductor substrate;
- forming a gate dielectric layer over a bottom surface and sidewalls of the trench;
- forming a first work function layer over the gate dielectric layer;
- exposing the first work function layer to a thermal process to form a pre-dipole induction layer between the first work function layer and the gate dielectric layer;
- forming a second work function layer over the first work function layer to fill the trench;
- recessing the second work function layer and the first work function layer to form a second work function portion and a first work function portion in the trench; and
- recessing the pre-dipole induction layer to form a dipole induction layer between the first work function portion and the gate dielectric layer,
- wherein an oxygen areal density of the pre-dipole induction layer is higher than an oxygen areal density of the gate dielectric layer.

13. The method according to claim 12, wherein the thermal process is performed in an oxygen-free atmosphere.

14. The method according to claim 12, wherein the forming of the dipole induction layer is performed by rapid thermal annealing.

15. The method according to claim 14, wherein the rapid thermal annealing is performed in a nitrogen or argon atmosphere.

16. The method according to claim 12, wherein the first work function layer comprises titanium nitride, and wherein the dipole induction layer comprises titanium oxide.

17. The method according to claim 12, further comprising:
- after the forming of the dipole induction layer,
- forming a third work function layer over the first work function portion and the second work function portion;
- recessing the third work function layer to form a third work function portion;
- forming a capping layer over the third work function portion; and
- introducing a dopant into the semiconductor substrate by using the capping layer as a barrier to form doping regions which overlap the third work function portion.

18. The method according to claim 17, wherein each of the doping regions does not overlap with the dipole induction layer.

19. The method according to claim 17, wherein the third work function layer has a work function lower than the first work function layer and the second work function layer.

20. The method according to claim 12, wherein the pre-dipole induction layer is formed by an oxidation of a portion of the first work function layer.

* * * * *